(12) United States Patent
Yukiiri et al.

(10) Patent No.: US 8,196,296 B2
(45) Date of Patent: Jun. 12, 2012

(54) METHOD FOR MANUFACTURING WIRING BOARD

(75) Inventors: Yuji Yukiiri, Nagano (JP); Izumi Tanaka, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 491 days.

(21) Appl. No.: 12/250,755

(22) Filed: Oct. 14, 2008

(65) Prior Publication Data

US 2009/0100673 A1    Apr. 23, 2009

(30) Foreign Application Priority Data

Oct. 15, 2007  (JP) ................................ 2007-267562

(51) Int. Cl.
*H05K 3/02* (2006.01)
*H05K 3/10* (2006.01)

(52) U.S. Cl. ............... 29/846; 29/825; 29/831; 29/848; 29/852

(58) Field of Classification Search .................... 29/846, 29/825, 830, 831, 847–849, 852; 174/260, 174/262, 266
See application file for complete search history.

(56) References Cited

U.S. PATENT DOCUMENTS 6,590,165 B1 * 7/2003 Takada et al. ................. 174/266
6,671,949 B2 * 1/2004 Yoshioka et al. ............... 29/852

FOREIGN PATENT DOCUMENTS

| JP | 6-304774 A | 11/1994 |
| JP | 2000-244115 | 9/2000 |
| JP | 2002-324974 A | 11/2002 |
| JP | 2004-241394 A | 8/2004 |

OTHER PUBLICATIONS

Office Action issued on Feb. 7, 2012 in the corresponding Japanese basic patent Application No. 2007-267562.

* cited by examiner

*Primary Examiner* — Thiem Phan
(74) *Attorney, Agent, or Firm* — Drinker Biddle & Reath LLP

(57) ABSTRACT

There is prepared an insulation layer generation member having a support film and a semi-cured insulation layer provided on a surface of the support film. Subsequently, the insulation layer generation member is affixed to a pad such that the pad contacts the semi-cured insulation layer. The semi-cured insulation layer is cured, to thus generate an insulation layer. Subsequently, the insulation layer is exposed to laser by way of the support film, thereby opening an opening in the insulation layer.

9 Claims, 38 Drawing Sheets

US 8,196,296 B2

METHOD FOR MANUFACTURING WIRING BOARD

TECHNICAL FIELD

The present disclosure relates to a method for manufacturing a wiring board having an insulation layer covering pads, openings that are formed in the insulation layer by means of laser and allow exposure of portions of the pads, and vias which are provided in the openings and connected to the pads.

RELATED ART

Related-art wiring boards include a build-up wiring board having a core substrate (see FIG. 1) and a coreless board not having a core substrate (see FIG. 2).

FIG. 1 is a cross-sectional view of the related-art wiring board.

By reference to FIG. 1, a related-art wiring board 200 is a build-up wiring board having a core substrate. The wiring board 200 has a core substrate 201, through electrodes 202, pads 203 and 217, insulation layers 204, 208, 218, and 223, vias 206, 209, 219, and 224, wiring patterns 207 and 221, electronic component connection pads 211, solder resists 212 and 227, diffusion prevention films 213 and 228, and external connection pads 226.

The through electrodes 202 are provided so as to penetrate through the core substrate 201. Upper ends of the through electrodes 202 are connected to the pads 203, and lower ends of the same are connected to the pads 217.

The pads 203 are provided at the upper ends of the through electrodes 202 as well as on an upper surface 201A of the core substrate 201. The insulation layer 204 is provided on the upper surface 201A of the core substrate 201 so as to cover portions of the pads 203. The insulation layer 204 has openings 231 through which upper surfaces of the pads 203 are partially exposed. The openings 231 are made by direct exposure of the insulation layer 204 to laser light. The vias 206 are provided in the respective openings 231. Lower ends of the vias 206 are connected to the respective pads 203. The vias 206 are formed integrally with the wiring patterns 207.

Each of the wiring patterns 207 has a pad 233 and a wiring 234. The pad 233 is provided on an upper surface 204A of the insulation layer 204. The pad 233 is provided integrally with the wiring 234. The wiring 234 is provided on the upper surface 204A of the insulation layer 204 as well as at an upper end of the via 206. The wiring 234 is made integrally with the vias 206. The wiring 234 electrically connects the via 206 to the pad 233.

The insulation layer 208 is provided on the upper surface 204A of the insulation layer 204 so as to cover the wiring 234. The insulation layer 208 has openings 236 through which the upper surfaces of the pads 233 are partially exposed. The openings 236 are made by direct exposure of the insulation layer 208 to laser light.

The vias 209 are provided in the respective openings 236. Lower ends of the vias 209 are connected to the respective pads 233. The electronic component connection pads 211 are provided at upper ends of the vias 209 as well as on the upper surface 208A of the insulation layer 208. The electronic component connection pads 211 are made integrally with the vias 209. Each of the electronic component connection pads 211 has a diffusion prevention film generation region 211A where the diffusion prevention film 213 is to be generated. The electronic component connection pads 211 are pads to be electrically connected to an electronic component (e.g., a semiconductor chip) by way of the diffusion prevention films 213.

The solder resist 212 is provided on the upper surface 208A of the insulation layer 208 so as to cover areas of the electronic component connection pads 211 except their diffusion prevention film generation regions 211A. The solder resist 212 has openings 202A through which the diffusion prevention film generation regions 211A are exposed. The diffusion prevention films 213 are provided so as to cover the diffusion prevention film generation regions 211A. The diffusion prevention films 213 are connected to an unillustrated electronic component (e.g., a semiconductor chip).

The pads 217 are provided at the lower ends of the through electrodes 202 as well as on the lower surface 201B of the core substrate 201. The pads 217 are electrically connected to the pads 203 by way of the through electrodes 202. The insulation layer 218 is provided on the lower surface 201B of the core substrate 201 so as to cover portions of the pads 217. The insulation layer 218 has openings 241 through which lower surfaces of the pads 217 are partially exposed. The openings 241 are made by direct exposure of the insulation layer 218 to laser light. The vias 219 are provided in the respective openings 241. Upper ends of the vias 219 are connected to the respective pads 217. The vias 219 are formed integrally with the wiring patterns 221.

Each of the wiring patterns 221 has a pad 242 and a wiring 243. The pad 242 is provided on a lower surface 218A of the insulation layer 218. The pads 242 are provided integrally with the wirings 243. The wirings 243 are provided on the lower surface 218A of the insulation layer 218 as well as at respective lower ends of the vias 219. Each of the wirings 243 is made integrally with the vias 219. Each of the wirings 243 electrically connects the via 219 to the pad 242.

The insulation layer 223 is provided on the lower surface 218A of the insulation layer 218 so as to cover the wirings 243. The insulation layer 223 has openings 245 through which the upper surfaces of the pads 242 are partially exposed. The openings 245 are made by direct exposure of the insulation layer 223 to laser light.

The vias 224 are provided in the respective openings 245. Upper ends of the vias 224 are connected to the respective pads 242. The external connection pads 226 are provided integrally with the vias 224. Each of the external connection pads 226 has a diffusion prevention film generation region 226A where the diffusion prevention film 228 is to be generated. The external connection pads 226 are pads to be electrically connected to a mount board (not shown); for instance, a mother board by way of the diffusion prevention films 228.

The solder resist 227 is provided on a lower surface 223A of the insulation layer 223 so as to cover areas of the external connection pads 226 except their diffusion prevention film generation regions 226A. The solder resist 227 has openings 227A through which the diffusion prevention film generation regions 226A are exposed. The diffusion prevention films 228 are provided in the diffusion prevention film generation regions 226A. External connection terminals (not shown) to be electrically connected to a mount board (not shown), such as a mother board, are provided on the diffusion prevention film 228.

In the wiring board 200 having the above configuration, a resin layer not including silica particles, a resin layer including silica particles, and the like, are used as the insulation layers 204, 208, 218, and 223. Use of the resin layer including silica particles as the insulation layers 204, 208, 218, and 223 enables a reduction in a difference between a coefficient of thermal expansion of the insulation layers 204, 208, 218, and 223 and a coefficient of thermal expansion of an electronic component (specifically, a semiconductor chip) to be mounted on the electronic component connection pads 211 when compared with a case where a resin layer not including silica particles is used (see; for instance, Patent Document 1).

FIG. 2 is a cross-sectional view of another related-art wiring board.

By reference to FIG. 2, another related-art wiring board 250 is a coreless board. The wiring board 250 has electronic component connection pads 251, insulation layers 253 and 257, vias 254 and 259, wiring patterns 255, external connection pads 261, and solder resists 263.

Each of the electronic component connection pads 251 has a connection surface 251A to which an unillustrated electronic component (e.g., a semiconductor chip) is to be connected. The electronic component connection pads 251 are embedded in the insulation layer 253 while the connection surfaces 251A remain exposed. The connection surfaces 251A are essentially flush with a surface 253A of the insulation layer 253 (i.e., a surface of the insulation layer 253 opposite to a surface 253B that contacts the insulation layer 257).

The electronic component connection pads 251 are embedded in the insulation layer 253 while the connection surfaces 251A are exposed. The insulation layer 253 has openings 265 through which surfaces 251B of the electronic component connection pads 251 on the opposite sides of the respective connection surfaces 251A are partially exposed. The openings 265 are made by direct exposure of the insulation layer 253 to laser light.

The vias 254 are provided in the respective openings 265. The vias 254 are at one end thereof connected to the electronic component connection pads 251. The vias 254 are made integrally with the wiring patterns 255.

Each of the wiring patterns 255 has a pad 271 and a wiring 272. The pad 271 is provided on the surface 253B of the insulation layer 253. The pads 271 are provided integrally with the wirings 272. The wirings 272 are provided on the surface 253B of the insulation layer 253 as well as at respective other ends of the vias 254. Each of the wirings 272 is made integrally with the via 254 and the pad 271. Each of the wirings 272 electrically connects the via 254 to the pad 271.

The insulation layer 257 is provided on the surface 253B of the insulation layer 253 so as to cover the wirings 272. The insulation layer 257 has openings 267 through which the pads 271 are partially exposed. The openings 267 are made by direct exposure of the insulation layer 257 to laser light.

The vias 259 are provided in the respective openings 267. The vias 259 are connected at one end to the respective pads 271. The vias 259 are made integrally with the external connection pads 261.

The external connection pads 261 are provided on the surface 257A of the insulation layer 257. Each of the external connection pads 261 has a terminal provision region 261A where an external connection terminal (not shown) is to be provided. The external connection pads 261 are pads to be electrically connected to a mount board (not shown), such as a mother board, by way of; for instance, external connection terminals (not shown). The external connection pads 261 are made integrally with the vias 259.

The solder resist 263 is provided on the surface 257A of the insulation layer 257. The solder resist 263 has openings 263A through which the terminal provision regions 261A are exposed.

Since the wiring board 250 configured as above does not have any core substrate, miniaturization of the wiring board in a thicknesswise direction (i.e., a reduction in the thickness of the wiring board) is possible; however, the wiring board 250 is susceptible to warpage. For this reason, in the wiring board 250, a resin layer made by impregnating glass fiber serving as a core material with a resin, a resin layer made by impregnating glass fiber serving as a core material with a resin containing a filler, such as silica particles, and other resin layers, are used as the insulation layers 253 and 257, thereby attempting a reduction in warpage of the wiring boards 250.

FIG. 3 is a view schematically showing a cross-sectional profile of a laser (laser light) used at the time of formation of openings in the insulation layer.

Laser 271 used at the time of formation of the openings 231, 236, 241, 245, 265, and 267 in the insulation layers 204, 208, 218, 223, 253, and 257 will now be described.

By reference to FIG. 3 the laser 271 has a high energy region 272, a low energy region 273, and a medium energy region 274.

The high energy region 272 is located at the center of the laser 271 and higher than the low energy region 273 and the medium energy region 274 in terms of energy intensity. An angle $\theta_1$ which an outer peripheral surface 272A of the high energy region 272 forms with a center line J of the laser 271 is smaller than an angle $\theta_3$ which an outer peripheral surface 273A of the low energy region 273 forms with the center line J of the laser 271 and an angle $\theta_2$ which an outer peripheral surface 274A of the medium energy region 274 forms with the center line J of the laser 271.

The low energy region 273 is located at an outer region of the laser 271 and lower than the high energy region 272 and the medium energy region 274 in terms of energy intensity. The angle $\theta_3$ which the outer peripheral surface 273A of the low energy region 273 forms with the center line J of the laser 271 is greater than the angle $\theta_1$ which the outer peripheral surface 272A of the high energy region 272 forms with the center line J of the laser 271 and the angle $\theta_2$ which the outer peripheral surface 274A of the medium energy region 274 forms with the center line J of the laser 271.

The medium energy region 274 is located between the high energy region 272 and the low energy region 273. The medium energy region 274 is higher than the low energy region 273 but lower than the high energy region 272 in terms of energy intensity. The angle $\theta_2$ which the outer peripheral surface 274A of the medium energy region 274 forms with the center line J of the laser 271 is greater than the angle $\theta_1$ which the outer peripheral surface 272A of the high energy region 272 forms with the center line J of the laser 271 but smaller than the angle $\theta_3$ which the outer peripheral surface 273A of the low energy region 273 forms with the center line J of the laser 271.

[Patent Document 1] Japanese Patent Unexamined Application Publication No. 2000-244115

FIG. 4 is a view for describing drawbacks in a method for manufacturing the related-art wiring board. In FIG. 4, constituent portions which are the same as those in a related-art wiring board 200 are assigned the same reference numerals.

As shown in FIG. 4, when the insulation layer 204 is exposed directly to the laser 271 configured as shown in FIG. 3, a portion of the laser 271 corresponding to the high energy region 272, a portion of the laser corresponding to the low energy region 273, and a portion of the laser corresponding to the medium energy region 274 are radiated on the insulation layer 204, whereupon the geometry of the outer peripheral surface 273A of the low energy region 273 located at the outer region of the laser 271 is transferred to a side surface of the opening 231. As a result, the side surface of the opening 231 assumes a noticeable tapered shape. A diameter $K_2$ of a lower end of the opening 231 becomes considerably smaller than a diameter $K_1$ of the upper end of the opening 231 (a diameter of the part of the opening 231 exposed to the laser 271).

For this reason, it has been difficult to reduce the diameter of the openings 231 while assuring the reliability of an electrical connection between the pad 203 and the via 206 provided in the opening 231.

In FIG. 4, the drawbacks in the related art are described by reference to the case where the openings 231 are formed in the insulation layer 204. The drawbacks also arise even in a case where the openings 236, 241, 245, 265, and 267 are formed in the insulation layers 208, 218, 223, 253, and 257.

When a resin layer having glass fiber difficult to be processed by the laser 271 and a filler, such as silica particles, is used as the insulation layers 204, 208, 218, 223, 253, and 257, the foregoing drawbacks become more noticeable. For example, the glass fiber is difficult to be processed by the portion of the laser corresponding to the low energy region 273, and the portion of the laser corresponding to the medium energy region 274. Hence, the glass fiber projects into the openings 231, 236, 241, 245, 265, and 267 of the insulation layers 204, 208, 218, 223, 253, and 257. As a result, in a case where the vias are generated by means of; for instance, plating, a sufficient amount of plating fluid cannot be supplied to the inside of the openings.

SUMMARY

Exemplary embodiments of the present invention provide a method for manufacturing a wiring board that enables a reduction in the diameter of openings formed in an insulation layer by means of laser.

According to one aspect of the present invention, there is provided a method for manufacturing a wiring board comprising:

an insulation layer generation member preparation step of preparing an insulation layer generation member having a support film and a semi-cured insulation layer provided on a surface of the support film;

an insulation layer generation member affixing step of affixing the insulation layer generation member to a pad such that the pad contacts the semi-cured insulation layer;

an insulation layer curing step of curing the semi-cured insulation layer after the insulation layer generation member affixing step; and an opening generation step of exposing the cured insulation layer to laser by way of the support film, thereby opening an opening in the cured insulation layer.

According to the present invention, there is prepared an insulation layer generation member having a support film and a semi-cured insulation layer provided on a surface of the support film. Subsequently, the insulation layer generation member is affixed to a pad such that the pad contacts the semi-cured insulation layer. After the semi-cured insulation layer is cured, the cured insulation layer is exposed to laser by way of the support film, thereby opening opening in the insulation layer. Thereby, the support films can prevent exposure of the insulation layers to a low energy region that is located at an outer region of the laser and has low energy intensity and a medium energy region that is located inside the low energy region and that is lower than the high energy region and higher than the low energy region in terms of energy intensity. Consequently, openings whose side surfaces are close in shape to a vertical geometry can be opened in the insulation layer by use of only the portions of the laser corresponding to the high energy region having an outer peripheral surface whose shape is close to a vertical geometry than a tapered shape of an outer peripheral surface of the low energy region and a tapered shape of an outer peripheral surface of the medium energy region (i.e., a difference between the diameters of both ends of the respective openings can be reduced), and hence the openings can be reduced in terms of a diameter.

According to the present invention, it is possible to reduce the diameter of openings formed in an insulation layer by means of laser (laser light).

Other features and advantages may be apparent from the following detailed description, the accompanying drawings and the claims.

DETAILED DESCRIPTION

Embodiments of the present invention will now be described by reference to the drawings.

(First Embodiment)

Figure 5:
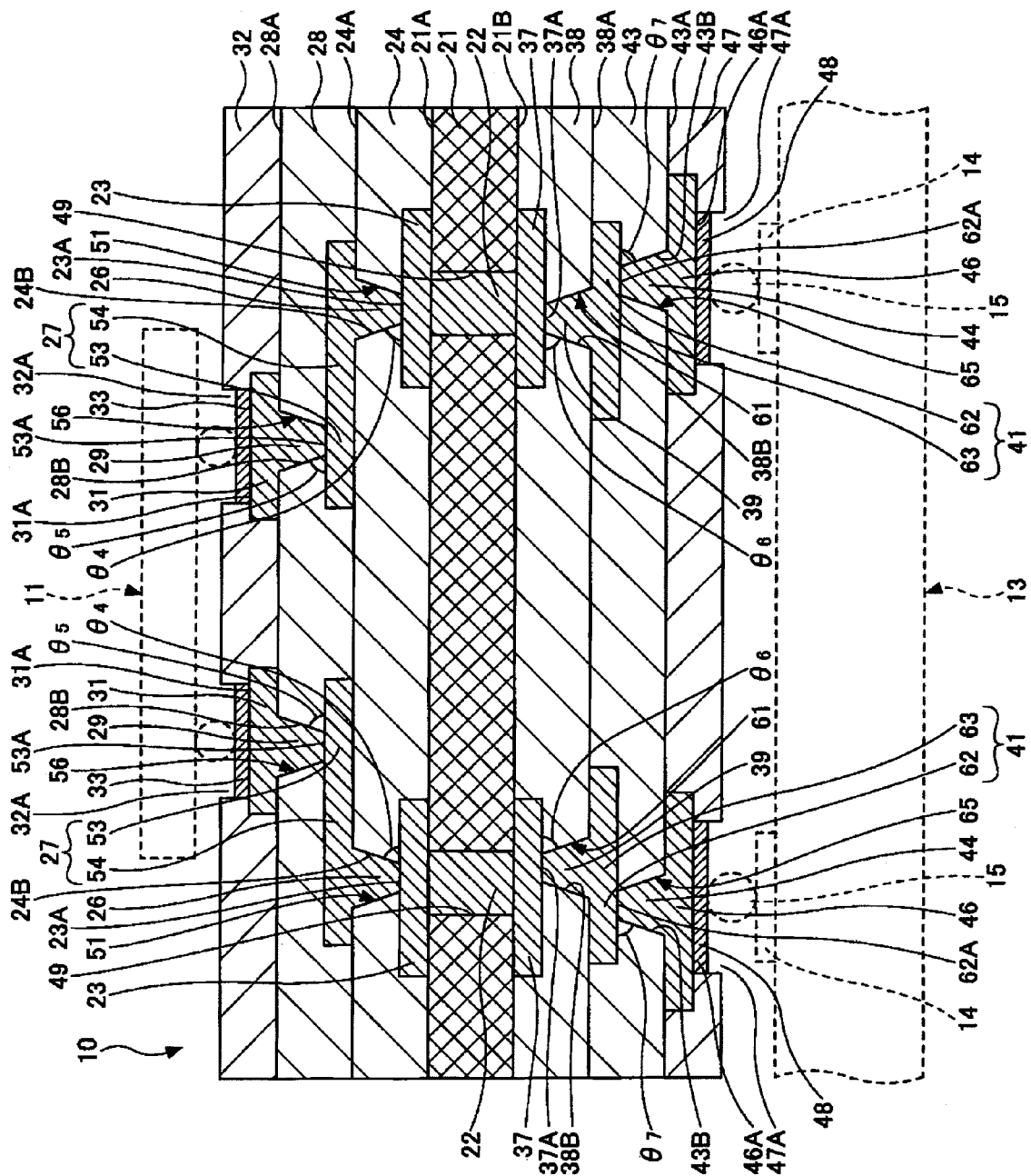
FIG. 5 is a cross-sectional view of a wiring board of a first embodiment of the present invention.

FIG. 5 is a cross-sectional view of a wiring board of a first embodiment of the present invention.

By reference to FIG. 5, a wiring board 10 of the first embodiment is a build-up wiring board having a core substrate. The wiring board 10 has a core substrate 21, through electrodes 22, pads 23 and 37, insulation layers 24, 28, 38, and 43, vias 26, 29, 39, and 44, wiring patterns 27 and 41, electronic component connection pads 31, solder resists 32 and 47, diffusion prevention films 33 and 48, and external connection pads 46.

The core substrate 21 assumes the shape of a plate and has through holes 49. The core substrate 21 is a substrate for supporting a build-up structural body fabricated in both surfaces 21A and 21B of the core substrate 21. Specifically, in the present embodiment, a build-up structural body made up of the pads 23, the insulation layers 24 and 28, the vias 26 and 29, the wiring patterns 27, the electronic component connection pads 31, the solder resists 32, and the diffusion prevention films 33 and a build-up structural body made up of the pads 37, the insulation layers 38 and 43, the vias 39 and 44, and the wiring patterns 41, the solder resists 47, the diffusion prevention films 48, and the external connection pads 46. For instance, a glass epoxy resin substrate made by impregnating glass fiber with epoxy resin can be used for the core substrate 21. When a glass epoxy resin substrate is used as the core substrate 21, the thickness of the core substrate 21 can be set to; for instance, 800 μm.

The through electrodes 22 are provided in the respective through holes 49. An upper end of each through electrode 22 is connected to the pad 23, and a lower end of the same is connected to the pad 37. Each of the through electrode 22 hereby electrically connects the pad 23 to the pad 37. For instance, Cu can be used as a material for the through electrodes 22.

Each of the pads 23 is provided on an upper end of the through electrode 22 as well as on an upper surface 21A of the core substrate 21. The pads 23 are electrically connected to the pads 37 provided on a lower surface 21B of the core substrate 21 by the through electrodes 22. For instance, Cu can be used as a material for the pads 23. The thickness of the pads 23 can be set to; for instance, 25 μm.

Figure 1:
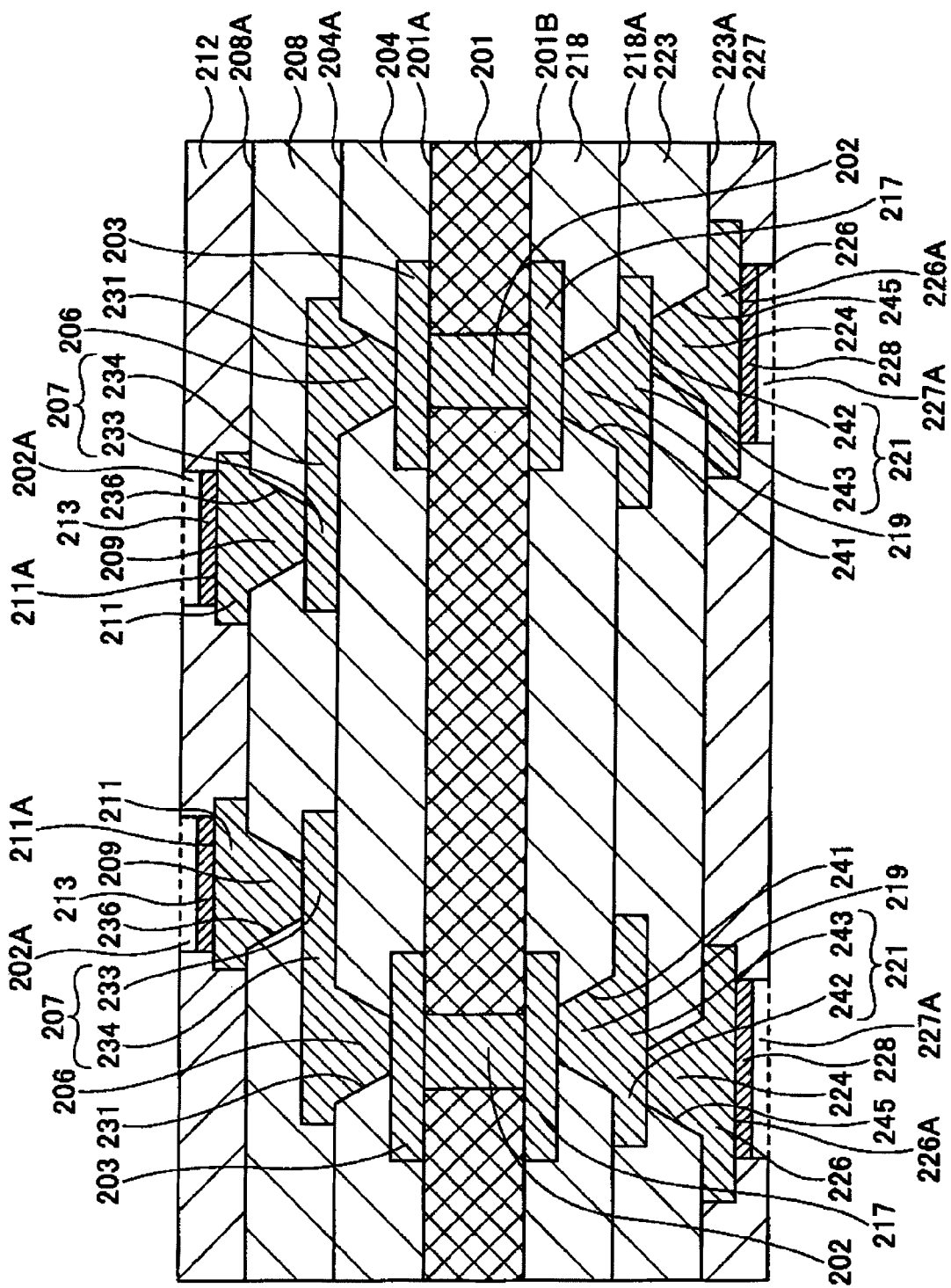
FIG. 1 is a cross-sectional view of a related-art wiring board.

The insulation layer 24 is provided on the upper surface 21A of the core substrate 21 so as to cover portions of the pads 23. The insulation layer 24 has openings 51 through which upper surfaces 23A of the pads 23 are partially exposed. The openings 51 are formed by use of the previously-described laser 271 (see FIG. 3). The openings 51 are opened in such a way that a difference between the diameter of one end of the opening and the diameter of the other end of the same becomes smaller than a difference between the diameter of one end of the opening 231 (see FIG. 1) provided in the related-art wiring board 200 and the diameter of the other end of the same. In short, the openings 51 are configured such that an angle $\theta_4$ which the surface 24B of the insulation layer 24 corresponding to the side surface of the opening 51 forms with the surface 23A of the pad 23 becomes close to an angle of 90 degrees.

For instance, a resin layer not including a filler such as silica particles, a resin layer containing a filler such as silica particles, and the like, can be used as the insulation layer 24 configured as mentioned above. When compared with the case where a resin layer not including silica particles is used, using; for instance, a resin layer containing silica particles, as the insulation layer 24 enables a reduction in difference between a coefficient of thermal expansion of the insulation layer 24 and a coefficient of thermal expansion of the electronic component 11 (e.g., a semiconductor chip) mounted on the electronic component connection pads 31. In addition to silica particles, alumina particles, silicon carbide particles, and the like, may also be used as a filler which will constitute the insulation layer 24. An epoxy resin having a thermosetting characteristic, a thermosetting polyolefin-based resin, and the like, can be used as a material for a resin layer which will constitute the insulation layer 24. A resin other than those mentioned above may also be used as a material for a resin layer which will constitute the insulation layer 24.

The thickness of the insulation layer 24 can be set to; for instance, 55 μm. In this case, the depth of the opening 51 can be set to 30 μm. When the depth of the opening 51 is 30 μm and when the diameter of the end of the opening 51 to be exposed to the laser 271 is 60 μm, the diameter of the end of the opening 51 located on the same side where the pad 23 is located can be set to; for instance, 55 μm.

The vias 26 are provided in the respective openings 51. Lower ends of the vias 26 are connected to the pads 23. Upper ends of the vias 26 are formed integrally with the wiring patterns 27.

Each of the wiring patterns 27 has a pad 53 and a wiring 54. The pads 53 are provided on the upper surface 24A of the insulation layer 24. The pads 53 are provided integrally with the wirings 54. The pads 53 are electrically connected to the vias 26 by way of the wirings 54. The wirings 54 are provided on the upper ends of the vias 26 and the upper surface 24A of the insulation layer 24. The wirings 54 are generated integrally with the vias 26 and the pads 53. For instance, Cu can be used as a material for the vias 26 and the wiring patterns 27.

An insulation layer 28 is provided on the upper surface 24A of the insulation layer 24 so as to cover the wirings 54. The insulation layer 28 has openings 56 through which upper surfaces 53A of the pads 53 are partially exposed. The openings 56 are formed by use of the previously-described layer 271 (see FIG. 3). Each of the openings 56 is formed in such a way that a difference between diameters of both ends of the opening becomes smaller than a difference between diameters of both ends of the opening 236 (see FIG. 1) provided in the related-art wiring board 200. Namely, the openings 56 are formed in such a way that an angle $\theta_5$ which a surface 28B of the insulation layer 28 corresponding to the side surface of the opening 56 forms with the upper surface 53A of the pad 53 becomes close to an angle of 90 degrees.

For instance, a resin layer not including a filler such as silica particles, a resin layer containing a filler such as silica particles, and the like, can be used as the insulation layer 28 configured as mentioned above. When compared with the case where a resin layer not including silica particles is used, using; for instance, a resin layer containing silica particles, as the insulation layer 28 enables a reduction in difference between a coefficient of thermal expansion of the insulation layer 28 and the coefficient of thermal expansion of the electronic component 11 (e.g., a semiconductor chip) mounted on the electronic component connection pads 31. In addition to silica particles, alumina particles, silicon carbide particles, and the like, may also be used as a filler which will constitute the insulation layer 28. An epoxy resin having a thermosetting characteristic, a thermosetting polyolefin-based resin, and the like, can be used as a material for a resin layer which will constitute the insulation layer 28. A resin other than those mentioned above may also be used as a material for a resin layer which will constitute the insulation layer 28.

The thickness of the insulation layer 28 can be set to; for instance, 45 μm. In this case, the depth of the opening 56 can be set to 30 μm. When the depth of the opening 56 is 30 μm and when the diameter of the end of the opening 56 to be exposed to the laser is 60 μm, the diameter of the end of the opening 56 located on the same side where the pad 53 is located can be set to; for instance, 55 μm.

The vias 29 are provided in the respective openings 56. Lower ends of the vias 29 are connected to the pads 53. Upper ends of the vias 29 are formed integrally with the electronic component connection pads 31.

The electronic component connection pads 31 are provided on an upper surface 28A of the insulation layer 28 and upper ends of the vias 29. Each of the electronic component connection pads 31 has a connection surface 31A on which a diffusion prevention film 33 is to be generated. The electronic component connection pads 31 are generated integrally with the vias 29. The electronic component connection pads 31 are electrically connected to the pads 53 by way of the vias 29. For instance, Cu can be used as a material for the vias 29 and the electronic component connection pads 31.

A solder resist 32 is provided on the upper surface 28A of the insulation layer 28 so as to cover the electronic component connection pads 31 except their connection surfaces 31A. The solder resist 32 has openings 32A through which the connection surfaces 31A of the electronic component connection pads 31 are exposed.

The diffusion prevention film 33 is provided so as to cover the connection surfaces 31A of the electronic component connection pads 31. The diffusion prevention film 33 is a film on which the electronic component 11 (e.g., a semiconductor chip) is to be mounted. For instance, a Ni/Au multilayer film made by stacking in sequence a Ni layer and an Au layer on the connection surface 31A; a Ni/Pd/Au multilayer film made by stacking in sequence a Ni layer; a Pd layer, and an Au layer on the connection surface 31A; a Pd/Au multilayer film made by stacking in sequence a Pd layer and an Au layer on the connection surface 31A; an Au layer; and the like, can be used as the diffusion prevention film 33. When the Ni/Pd/Au multilayer film is used as the diffusion prevention film 33, a Ni/Pd/Au multilayer film is generated by means of stacking in sequence a Ni layer (having a thickness of; for instance, 3 μm or more), a Pd layer (having a thickness of; for instance, 0.1 μm or less), and an Au layer (having a thickness of; for instance, 0.01 μm to 0.5 μm) by means of; for example, electroless plating.

The pads 37 are provided on the lower surface 21B of the core substrate 21 and lower ends of the through electrodes 21. The pads 37 are electrically connected to the pads 37 provided on the upper surface 21A of the core substrate 21 by way of the through electrodes 22. For instance, Cu can be used as a material for the pads 37. The thickness of the pads 37 can be set to; for instance, 25 μm.

The insulation layer 38 is laid on the lower surface 21B of the core substrate 21 so as to cover the portions of the pads 37. The insulation layer 38 has openings 61 through which the lower surfaces 37A of the pads 23 are partially exposed. The openings 61 are formed by use of the previously-described laser 271 (see FIG. 3). The openings 61 are formed in such a way that a difference between the diameter of one end of the opening and the diameter of the other end of the same becomes smaller than a difference between the diameter of one end of the opening 241 (see FIG. 1) provided in the related-art wiring board 200 and the diameter of the other end of the same. In short, the openings 61 are configured such that an angle $\theta_6$ which the surface 38B of the insulation layer 38 corresponding to the side surface of the opening 61 forms with the lower surface 37A of the pad 37 becomes close to an angle of 90 degrees.

For instance, a resin layer not including a filler such as silica particles, a resin layer containing a filler such as silica particles, and the like, can be used as the insulation layer 38 configured as mentioned above. When compared with the case where a resin layer not including silica particles is used, using; for instance, a resin layer containing silica particles, as the insulation layer 38 enables a reduction in difference between a coefficient of thermal expansion of the insulation layer 38 and a coefficient of thermal expansion of the electronic component 11 (e.g., a semiconductor chip) mounted on the electronic component connection pads 31 by way of the diffusion prevention film 33. In addition to silica particles, alumina particles, silicon carbide particles, and the like, may also be used as a filler which will constitute the insulation layer 38. An epoxy resin having a thermosetting characteristic, a thermosetting polyolefin-based resin, and the like, can be used as a material for a resin layer which will constitute the insulation layer 38. A resin other than those mentioned above may also be used as a material for a resin layer which will constitute the insulation layer 38.

The thickness of the insulation layer 38 can be set to; for instance, 55 μm. In this case, the depth of the opening 61 can be set to 30 μm. When the depth of the opening 61 is 30 μm and when the diameter of the end of the opening 61 to be exposed to the laser is 60 μm, the diameter of the end of the opening 61 located on the same side where the pad 37 is located can be set to; for instance, 55 μm.

The vias 39 are provided in the respective openings 61. Upper ends of the vias 39 are connected to the pads 37. Lower ends of the vias 39 are formed integrally with the wiring patterns 41.

Each of the wiring patterns 41 has a pad 62 and a wiring 63. The pads 62 are provided on the lower surface 38A of the insulation layer 38. The pads 62 are provided integrally with the wirings 63. The pads 62 are electrically connected to the vias 39 by way of the wirings 63. The wirings 63 are provided on the lower ends of the vias 39 and the lower surface 38A of the insulation layer 38. The wirings 63 are generated integrally with the vias 39 and the pads 62. For instance, Cu can be used as a material for the vias 39 and the wiring patterns 41.

An insulation layer 43 is provided on the lower surface 38A of the insulation layer 38 so as to cover the wirings 63. The insulation layer 43 has openings 65 through which lower surfaces 62A of the pads 62 are partially exposed. The openings 65 are formed by use of the previously-described layer 271 (see FIG. 3). Each of the openings 65 is formed in such a way that a difference between diameters of both ends of the opening becomes smaller than a difference between diameters of both ends of the opening 245 (see FIG. 1) provided in the related-art wiring board 200. Namely, the openings 65 are formed in such a way that an angle $\theta_7$ which a surface 43B of the insulation layer 43 corresponding to the side surface of the opening 65 forms with the lower surface 62A of the pad 62 becomes close to an angle of 90 degrees.

For instance, a resin layer not including a filler such as silica particles, a resin layer containing a filler such as silica particles, and the like, can be used as the insulation layer 43 configured as mentioned above. When compared with the case where a resin layer not including silica particles is used, using; for instance, a resin layer containing silica particles, as the insulation layer 43 enables a reduction in difference between a coefficient of thermal expansion of the insulation layer 43 and the coefficient of thermal expansion of the electronic component 11 (e.g., a semiconductor chip) mounted on the electronic component connection pads 31 by way of the diffusion prevention film 33. In addition to silica particles, alumina particles, silicon carbide particles, and the like, may also be used as a filler which will constitute the insulation layer 43. An epoxy resin having a thermosetting characteristic, a thermosetting polyolefin-based resin, and the like, can be used as a material for a resin layer which will constitute the insulation layer 43. A resin other than those mentioned above may also be used as a material for a resin layer which will constitute the insulation layer 43.

The thickness of the insulation layer 43 can be set to; for instance, 45 μm. In this case, the depth of the opening 65 can be set to 30 μm. When the depth of the opening 65 is 30 μm and when the diameter of the end of the opening 65 to be exposed to the laser is 60 μm, the diameter of the end of the opening 65 located on the same side where the pad 62 is located can be set to; for instance, 55 μm.

The vias 44 are provided in the respective openings 65. Upper ends of the vias 44 are connected to the pads 62. The vias 44 are formed integrally with the external connection pads 46.

The external connection pads 46 are provided on the lower surface 43A of the insulation layer 43 and lower ends of the vias 44. Each of the external connection pads 46 has a connection surface 46A on which a diffusion prevention film 48 is to be generated. The external connection pads 46 are pads which are electrically connected to the mount substrate 13, such as a mother board, by way of the diffusion prevention films 48. The external connection pads 46 are generated integrally with the vias 44. For instance, Cu can be used as a material for the vias 44 and the external connection pads 46.

A solder resist 47 is provided on the lower surface 43A of the insulation layer 43 so as to cover the external connection pads 46 except their connection surfaces 46A. The solder resist 47 has openings 47A through which the connection surfaces 46A of the external connection pads 46 are exposed.

The diffusion prevention film 48 is provided so as to cover the connection surfaces 46A of the external connection pads 46. The diffusion prevention film 48 is a film on which the external connection terminals 15 (e.g., solder balls) are to be provided. For instance, a Ni/Au multilayer film made by stacking in sequence a Ni layer and an Au layer on the connection surface 46A; a Ni/Pd/Au multilayer film made by stacking in sequence a Ni layer, a Pd layer, and an Au layer on the connection surface 46A; a Pd/Au multilayer film made by stacking in sequence a Pd layer and an Au layer on the connection surface 46A; an Au layer; and the like, can be used as the diffusion prevention film 48. When the Ni/Pd/Au multilayer film is used as the diffusion prevention film 48, a Ni/Pd/Au multilayer film is generated by means of stacking in sequence a Ni layer (having a thickness of; for instance, 3 μm or more), a Pd layer (having a thickness of; for instance, 0.1 μm or less), and an Au layer (having a thickness of; for instance, 0.01 μm to 0.5 μm) by means of; for example, electroless plating.

FIGS. 6 through 16 are views showing processes for manufacturing the wiring board of the first embodiment of the present invention. In FIGS. 6 through 16, constituent elements which are the same as those of the wiring board 10 of the first embodiment are assigned the same reference numerals.

By reference to FIGS. 6 through 16, the method for manufacturing the wiring board 10 of the first embodiment will be described. First, in the process shown in FIG. 6, the through holes 49, the through electrodes 22, and the pads 23 and 37 are formed, by means of a known technique, in a core substrate 71 having a plurality of wiring board generation areas A where the wiring board 10 are to be fabricated. The core substrate 71 is a substrate which is to be cut along cut positions B into a plurality of core substrates 21 (which are one of constituent elements of the wiring boards 10 shown in FIG. 5). For example, a glass epoxy resin substrate made by impregnating glass fiber with epoxy resin can be used for the core substrate 71. When the glass epoxy resin substrate is used for the core substrate 71, the thickness of the core substrate 71 can be set to; for instance, 800 μm.

The through holes 49 can be opened by use of; for instance, a drill. The through electrodes 22 and the pads 23, 37 can be generated by means of; for instance, plating. In this case, Cu can be used as a material for the through electrodes 22 and the pads 23 and 37.

Figure 7:
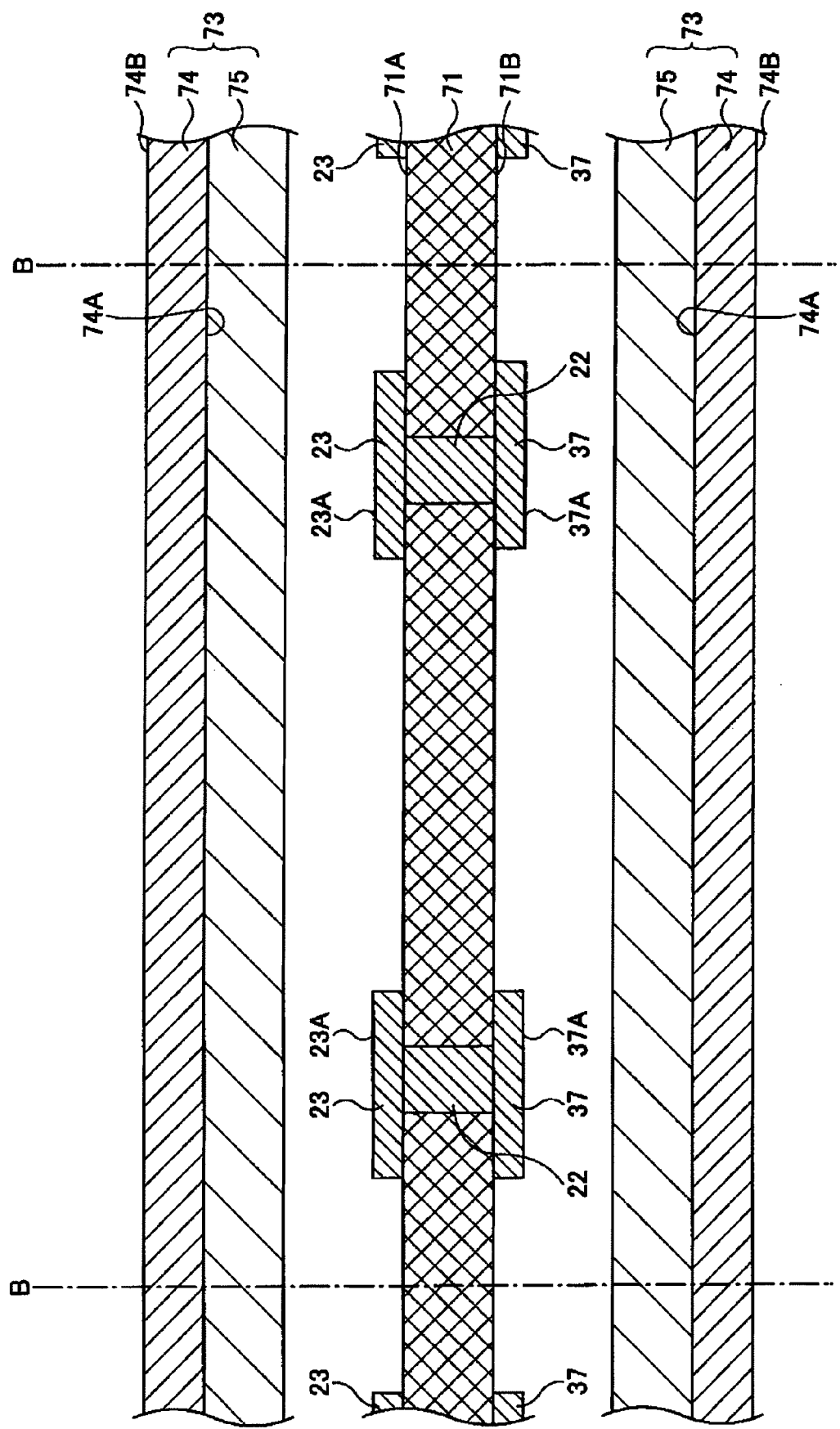
FIG. 7 is a view (part 2) showing the process for manufacturing the wiring board of the first embodiment of the present invention.

In the process shown in FIG. 7, there is prepared an insulation layer generation member 73 having a support film 74 and an insulation layer 75 that is provided on a surface 74A (one surface) of the support film 74 and that is in a semi-cured state (an insulation layer generation member preparation step). Two insulation layer generation members 73 are prepared in this process. The support film 74 is a film for supporting the insulation layer 75. For instance, polyester such as PET (polyethylene terephthalate), polyethylene, polyolefin such as polyvinyl chloride, polycarbonate, and the like, can be used as a material for the support film 74. The thickness of the support film 74 can be set to; for instance, 30 μm to 40 μm.

The insulation layer 75 brought into a semi-cured state is cured in a process shown in FIG. 9 to be described later, to thus turn into the insulation layers 24 and 38. For instance, a semi-cured resin layer not including a filler such as silica particles, a semi-cured resin layer containing a filler such as silica particles, and the like, can be used as the semi-cured insulation layer 75. In addition to silica particles, alumina particles, silicon carbide particles, and the like, may also be used as a filler which will constitute the insulation layer 75. An epoxy resin having a thermosetting characteristic, a thermosetting polyolefin-based resin, and the like, can be used as a material for a semi-cured resin layer which will constitute the insulation layer 75. A resin other than those mentioned above may also be used as a material for a semi-cured resin layer which will constitute the insulation layer 75. The thickness of the semi-cured insulation layer 75 can be set to; for instance, 30 μm to 40 μm.

Figure 6:
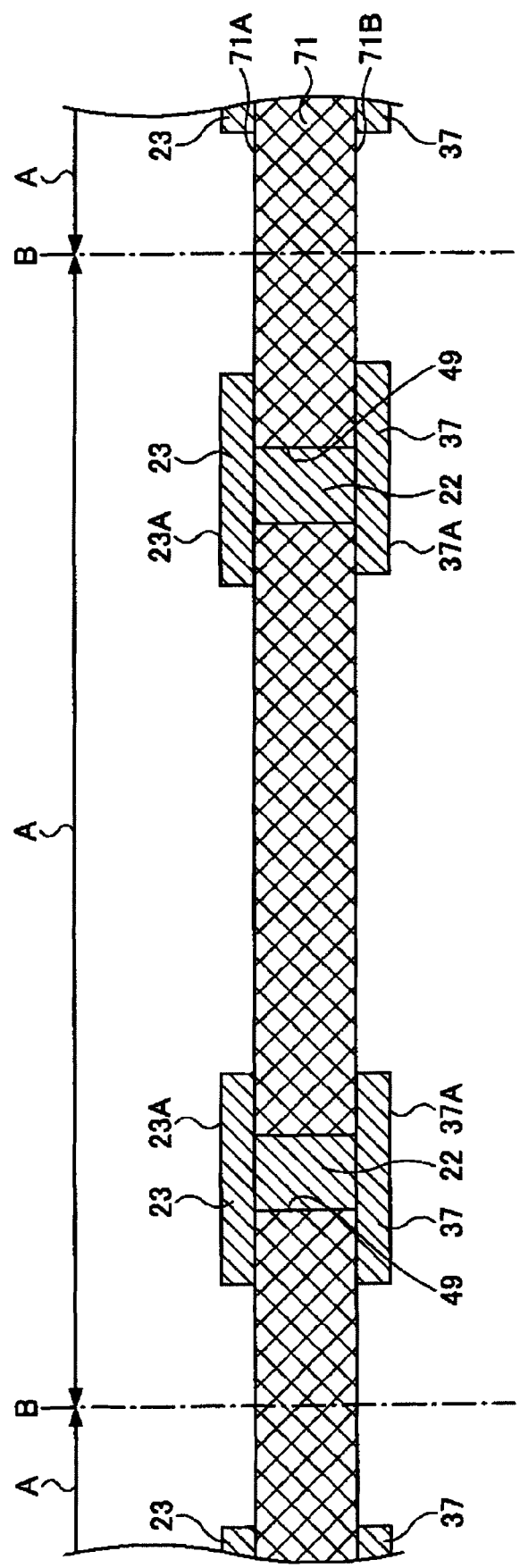
FIG. 6 is a view (part 1) showing a process for manufacturing the wiring board of the first embodiment of the present invention.
Figure 8:
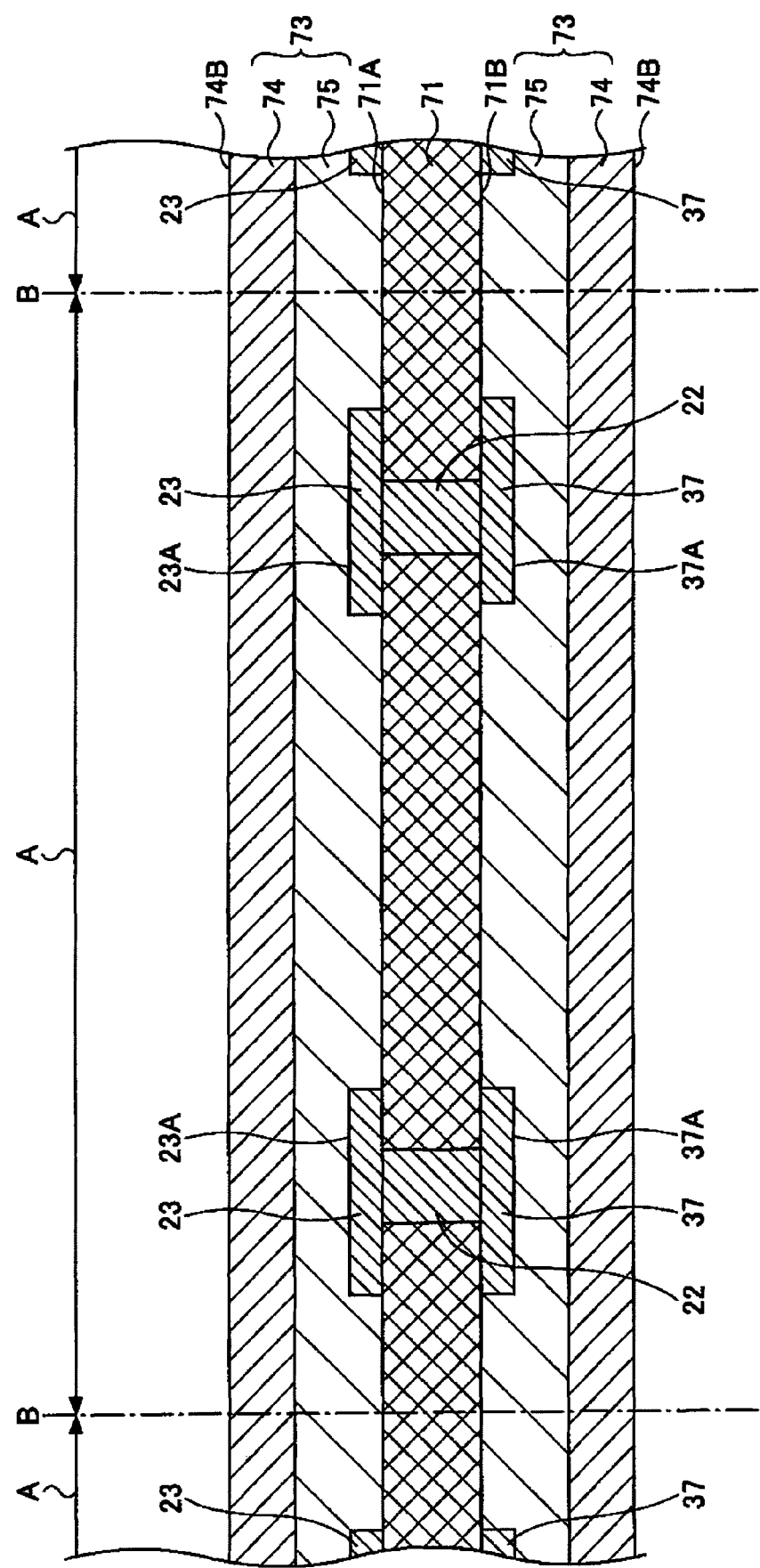
FIG. 8 is a view (part 3) showing the process for manufacturing the wiring board of the first embodiment of the present invention.

In a process shown in FIG. 8, the insulation layer generation member 73 is affixed to both surfaces of the structure shown in FIG. 6 in such a manner that both surfaces of the structure shown in FIG. 6 (specifically, the upper surface 71A of the core substrate 71 on which the pads 23 are formed and the lower surface 71B of the core substrate 71 on which the pads 37 are formed) contact the semi-cured insulation layer 75 (an insulation layer generation member affixing step). Specifically, the insulation layer generation member 73 is affixed to both surfaces of the structure shown in FIG. 6 by means of; for instance, vacuum thermo-compression bonding. The insulation layer 75 affixed to the upper surface 71A of the core substrate 71 is a layer which will turn into the insulation layer 24 (see FIG. 5) as a result of being cured in a process shown in FIG. 9 to be described later. The insulation layer 75 affixed to the lower surface 71B of the core substrate 71 is a layer which will turn into the insulation layer 38 (see FIG. 5) as a result of being cured in the process shown in FIG. 9 to be described later.

Figure 9:
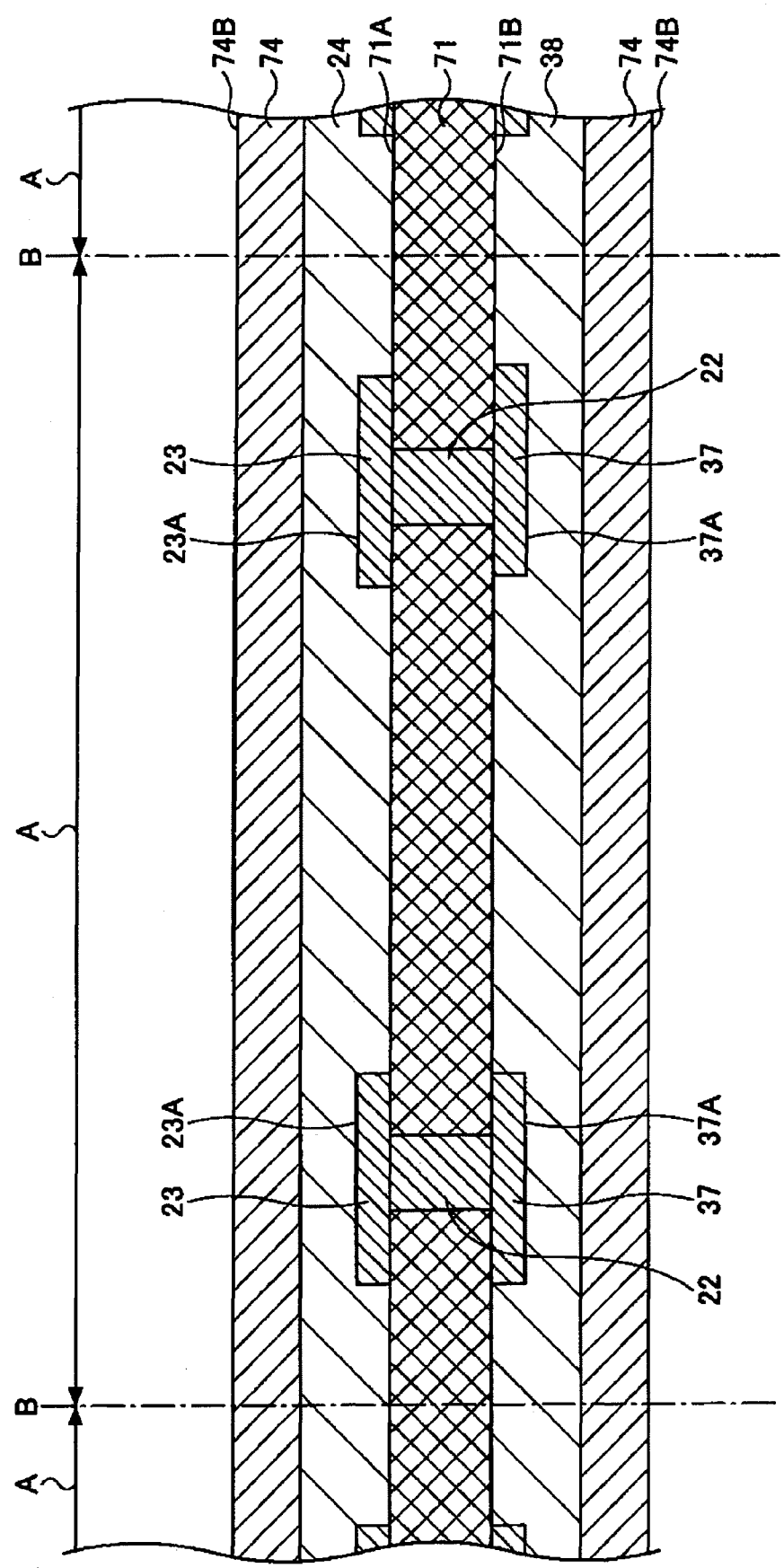
FIG. 9 is a view (part 4) showing the process for manufacturing the wiring board of the first embodiment of the present invention.

Next, the insulation layers 75, which are semi-cured and shown in FIG. 8, are cured in the process shown in FIG. 9, thereby simultaneously generating the insulation layer 24 (a cured insulation layer) on the upper surface 71A of the core substrate 71 and the insulation layer 38 (a cured insulation layer) on the lower surface 71B of the core substrate 71 (an insulation layer curing step). Specifically, for instance, when the insulation layers 75 are formed from a thermosetting resin that serves as a base material, the structure shown in FIG. 8 is heated (at a heating temperature of; for instance, 180° C.), to thus generate the cured insulation layers 24 and 38.

Subsequently, in a process shown in FIG. 10, the cured insulation layers 24 and 38 are exposed to the laser 271 (see FIG. 3) by way of the support films 74. Put another way, the surface 74B of the support film 74 (the surface of the support film 74 that is not in contact with the insulation layers 24 and 38) is exposed to the laser 271, to thus generate, in the insulation layer 24, the openings 51 through which the upper surfaces 23A of the pads 23 are partially exposed and, in the insulation layer 38, the openings 61 through which the lower surfaces 37A of the pads 37 are partially exposed (an opening generation step).

Figure 17:
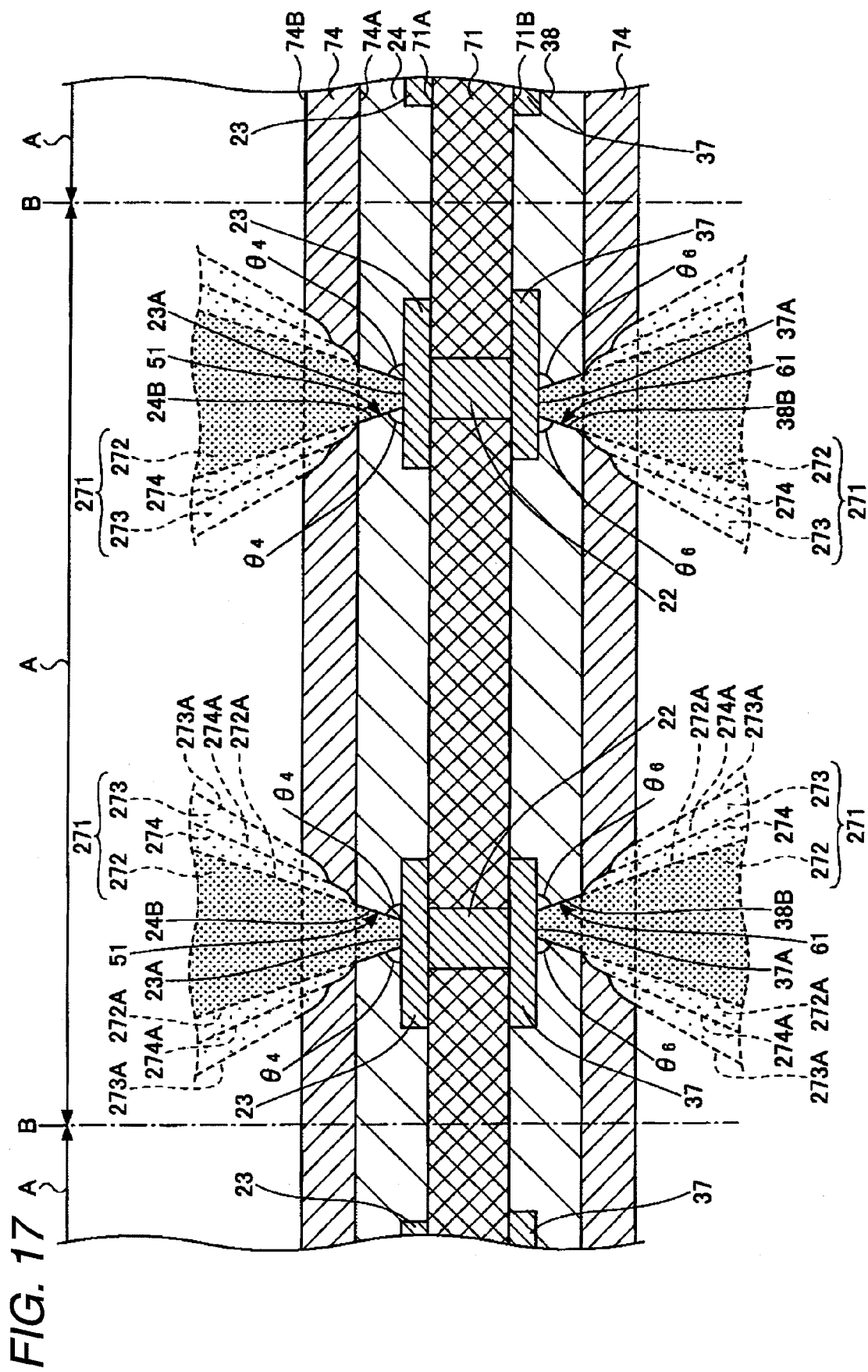
FIG. 17 is a view schematically showing a cross-sectional profile of laser radiated onto support films and insulation layers in the process for generating the openings.

FIG. 17 is a view schematically showing a cross-sectional profile of the support film and a cross-sectional profile of the laser radiated onto the insulation layer in the opening generation process. In FIG. 17, constituent elements which are the same as those of the laser 271 shown in previously-described FIG. 3 and the structure shown in FIG. 10 are assigned the same reference numerals.

There will now be described operation achieved in a case where the laser 271 (see FIG. 3) is radiated on the insulation layers 24 and 38 by way of the support films 74 while the support films 74 remain affixed to the insulation layers 24 and 38, to thus open the openings 51 and 61.

As shown in FIG. 17, the laser 271 is radiated to the cured insulation layers 24 and 38 by way of the support films 74, to thus open the openings 51 and 61 in the insulation layers 24 and 38. As a result, the support films 74 can prevent exposure of the insulation layers 24 and 38 to a portion of the laser 271 corresponding to the low energy region 273 that is located at an outer region of the laser 271 and has low energy intensity and a portion of the laser 271 corresponding to the medium energy region 274 that is located inside of the low energy region and that is lower than the high energy region 272, which is located in the center of laser and has high energy intensity, and higher than the low energy region 273 in terms of energy intensity.

As a result, the openings 51 and 61 can be opened by use of only the portion of the laser 271 corresponding to the high energy region 272 having the outer peripheral surface 272A whose shape is close to a vertical geometry than a tapered shape of the outer peripheral surface 273A of the low energy region 273 and a tapered shape of the outer peripheral surface 274A of the medium energy region 274 (in other words, the angles $\theta_4$ and $\theta_6$ are close to 90 degrees). As a result, the openings 51 and 61 whose side surfaces have shapes close to the vertical geometry can be opened in the insulation layers 24 and 38 (i.e., the difference between the diameters of both ends of the respective openings 51 and the difference between the diameters of both ends of the respective openings 61 can be reduced), and hence the openings 51 and 61 can be reduced in terms of a diameter.

The openings 51 and 61 are generated by exposing the insulation layers 24 and 38 to the laser 271 (see FIG. 3) by way of the support films 74 while the support films 74 remain affixed to the insulation layers 24 and 38, thereby preventing adhesion of debris to the surfaces 24A and 38A of the insulation layers 24 and 38, which would otherwise arise during laser processing (e.g., chips of the insulation layers 24 and 38). Hence, the wiring patterns 27 and 41 can be generated with superior accuracy on the surfaces 24A and 38A of the insulation layers 24 and 38.

When the depth of the openings 51 and 61 is 30 μm and when the diameter of the ends of the openings 51 and 61 to be exposed to the laser 271 is 60 μm, the diameter of the other ends of the respective openings 51 and 61 can be set to; for instance, 55 μm.

Figure 10:
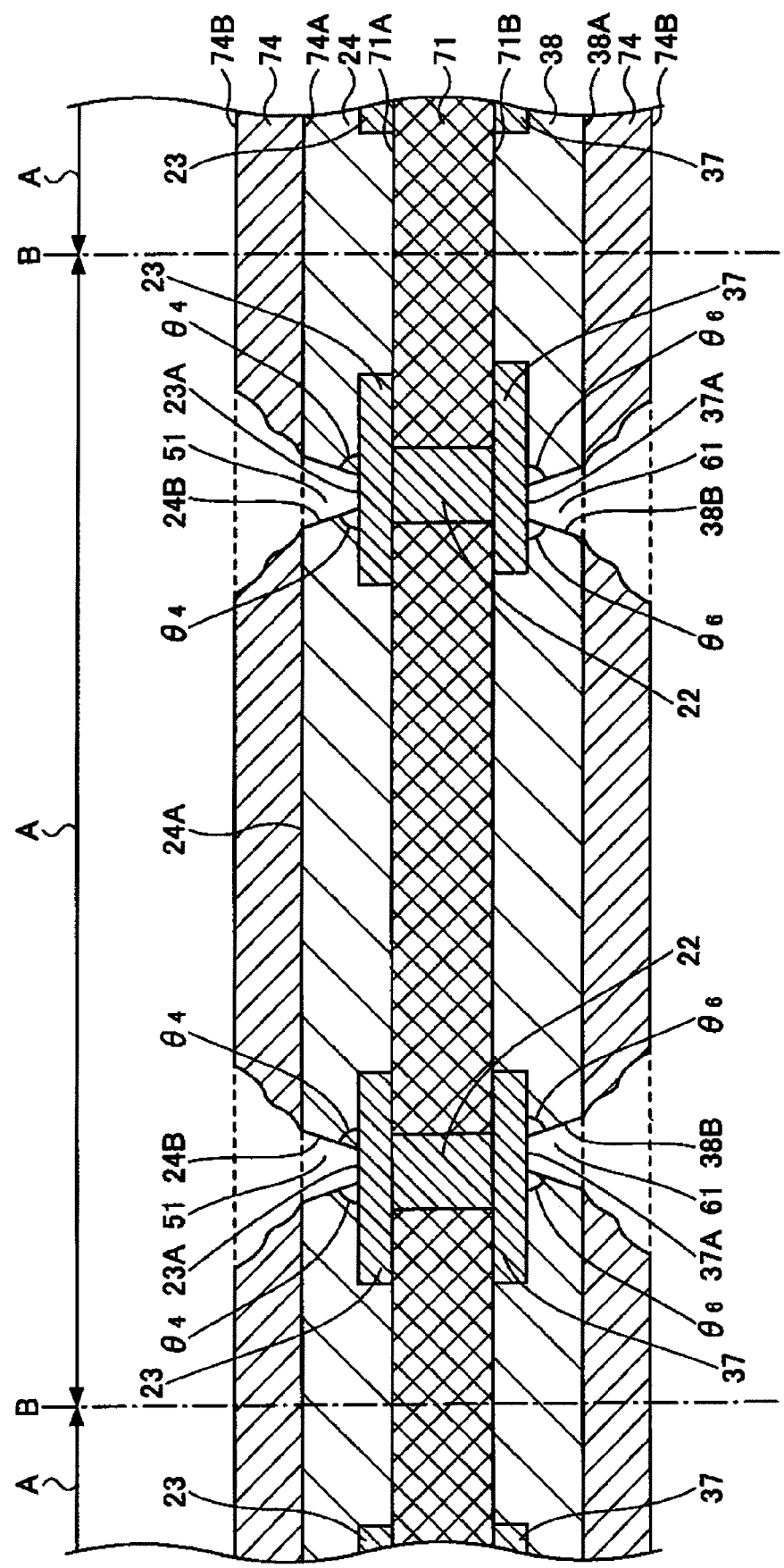
FIG. 10 is a view (part 5) showing the process for manufacturing the wiring board of the first embodiment of the present invention.
Figure 11:
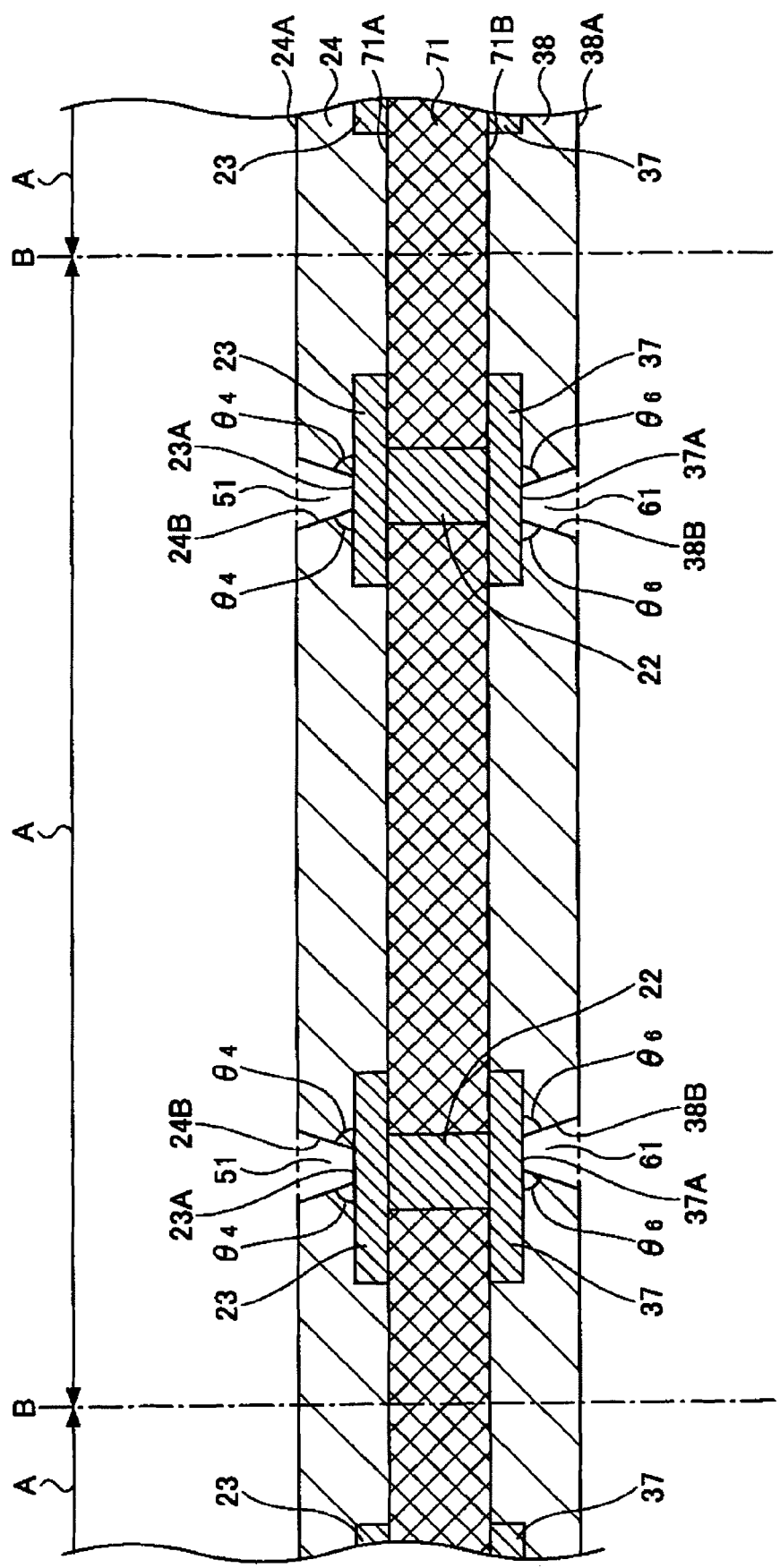
FIG. 11 is a view (part 6) showing the process for manufacturing the wiring board of the first embodiment of the present invention.

Next, the two support films 74 provided on the structure shown in FIG. 10 are removed in a process shown in FIG. 11 (a support film removal step). Specifically, the support films 74 are striped from the insulation layers 24 and 38 provided on the structure shown in FIG. 10, thereby removing the support films 74.

Figure 12:
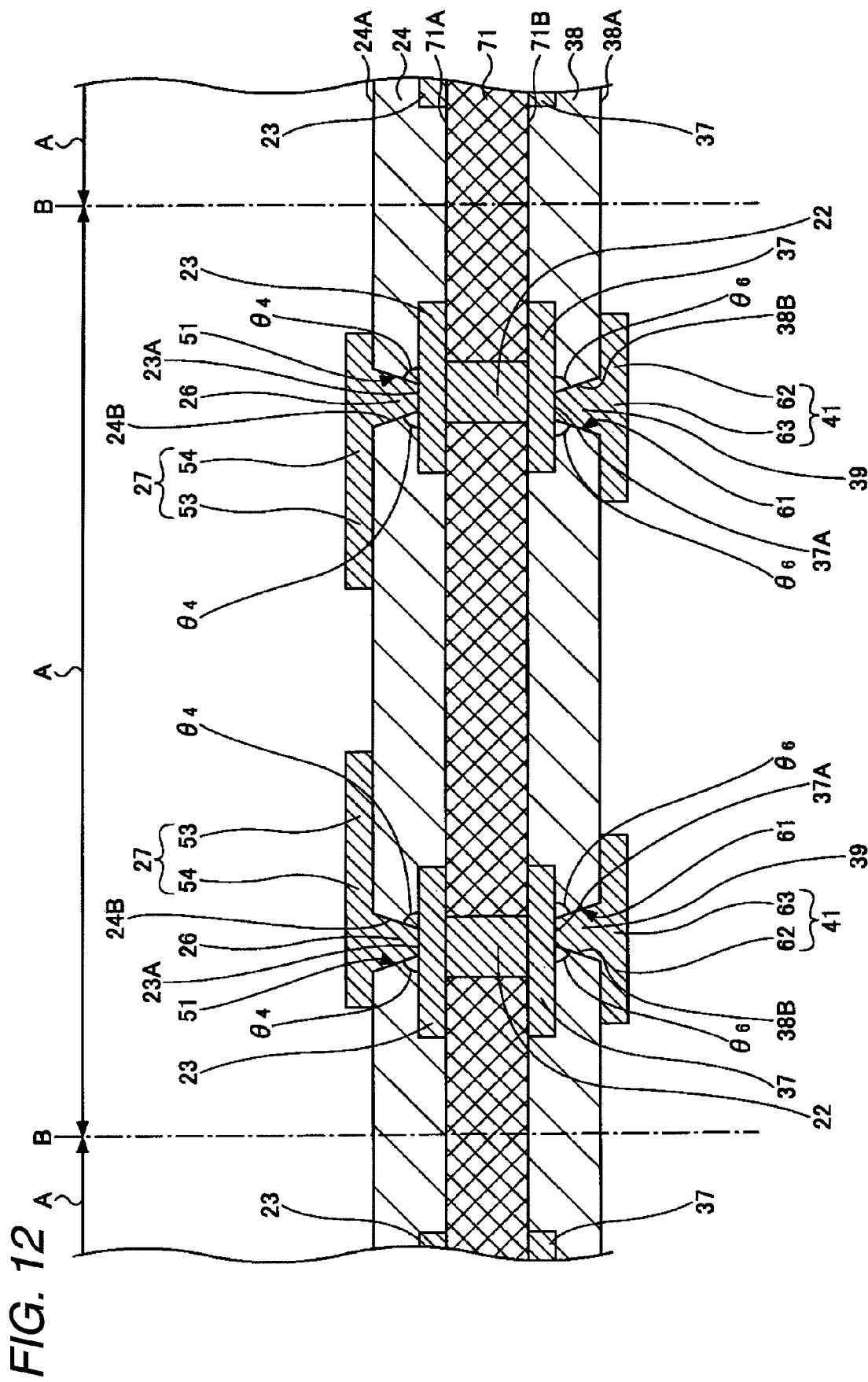
FIG. 12 is a view (part 7) showing the process for manufacturing the wiring board of the first embodiment of the present invention.

The vias 26, 39 and the wiring patterns 27, 41 are simultaneously generated in a process shown in FIG. 12 by means of a known technique (a via generation step). The vias 26, 39 and the wiring patterns 27, 41 can be generated by means of; for instance, a semi-additive process.

Specifically, in this case, the upper surface 24A and the surface 24B of the insulation layer 24 and the lower surface 38A and the surface 38B of the insulation layer 38 are made coarse by means of a roughening process. Next, a seed layer (not shown) is produced so as to cover the upper surface 24A and the surface 24B of the roughened insulation layer 24, the lower surface 38A and the surface 38B of the roughened insulation layer 38, the upper surfaces 23A of the pads 23 exposed through the openings 51, and the lower surfaces 37A of the pads 37 exposed through the openings 61. A resist film (not shown) having openings corresponding to areas where the wiring patterns 27 are to be generated is formed on the upper surface 24A of the insulation layer 24. A resist film (not shown) having openings corresponding to areas where the wiring patterns 41 are to be generated is formed on the lower surface 38A of the insulation layer 38.

By means of an electrolytic plating method that uses a seed layer as a feed layer, a plating film [e.g., a Cu plating film (having a thickness of; for instance, 15 μm)] is generated, through deposition growth, on areas of the seed layer exposed through the opening sections of the resist film. Subsequently, the resist film and an unwanted seed layer covered with the resist film are eliminated, thereby simultaneously generating the vias 26, 39 and the wiring patterns 27, 41. For instance, desmearing can be used as the roughening process. Moreover, a Cu layer (having a thickness of; for instance, 0.1 μm) generated by means of electroless plating or sputtering can be used as the seed layer.

It is better to remove the support films 74 immediately before generations of the vias 26 and 39. As mentioned above, as a result of removal of the support films 74 immediately before formation of the vias 26 and 39, adhesion of extraneous matters to the upper surface 24A of the insulation layer 24 and the lower surface 38A of the insulation layer 38 or infliction of flaws in the insulation layers 24 and 38, which would otherwise be caused by handling (conveyance), can be prevented. Yields of the wiring boards 10 can be hereby enhanced.

Figure 13:
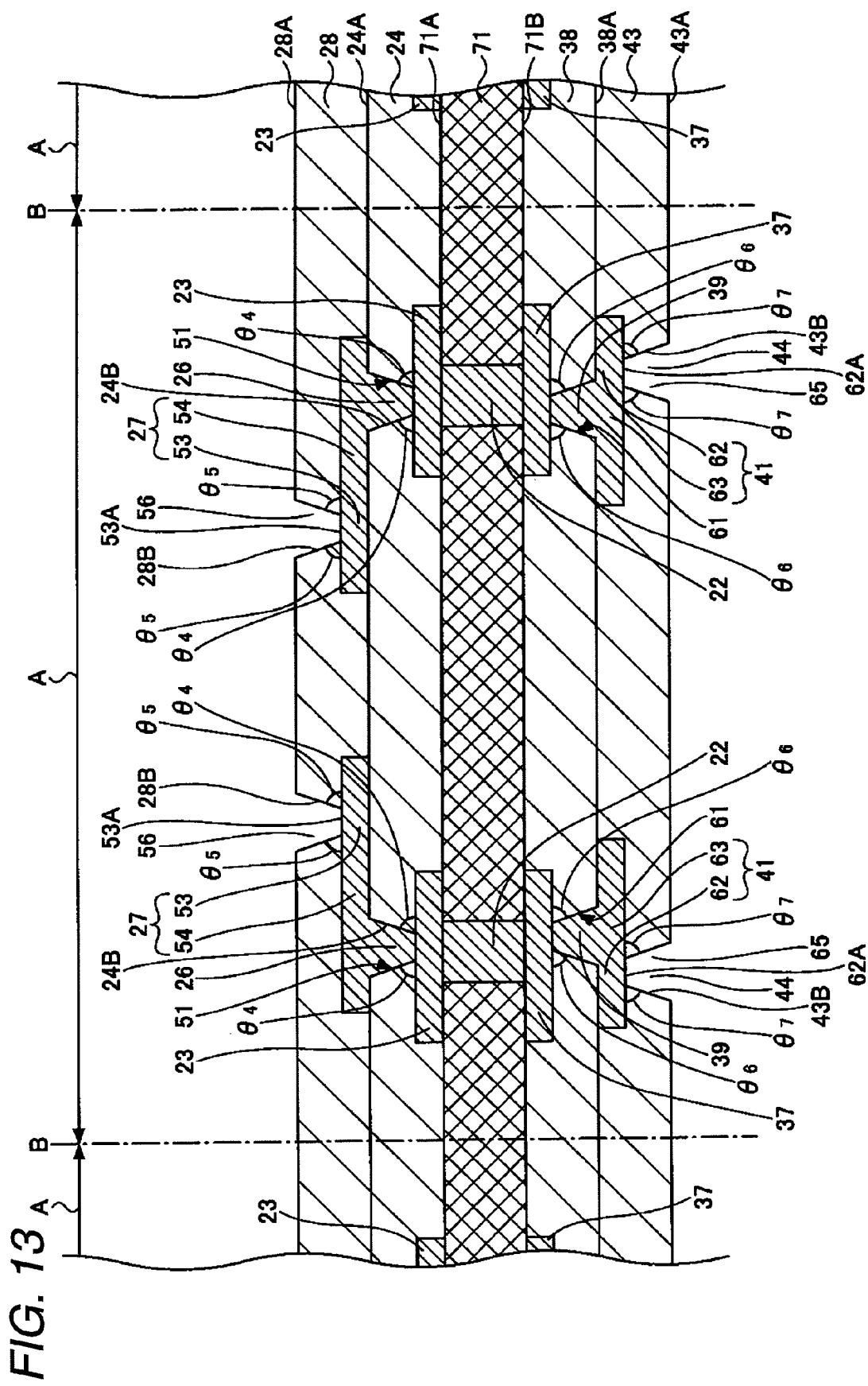
FIG. 13 is a view (part 8) showing the process for manufacturing the wiring board of the first embodiment of the present invention.

Next, processing similar to that pertaining to the previously-described processes shown in FIGS. 7 through 10 is performed in a process shown in FIG. 13, whereby the insulation layer 28 having openings 56 and the insulation layer 43 having the openings 65 are formed on the structure shown in FIG. 12.

Thus, the laser 271 is radiated to the cured insulation layers 28 and 43 by way of the support films 74, to thus open the openings 56 and 65 in the insulation layers 28 and 43. As a result, the support films 74 can prevent exposure of the insulation layers 28 and 43 to the portion of the laser 271 corresponding to the low energy region 273 that is located at the outer region of the laser 271 and has low energy intensity and the portion of the laser 271 corresponding to the medium energy region 274 that is lower than the high energy region 272 and higher than the low energy region 273 in terms of energy intensity.

As a result, the openings 56 and 65 having side surfaces whose profile are close to a vertical geometry can be opened by use of only the portion of the laser 271 corresponding to the high energy region 272 having the outer peripheral surface 272A whose shape is close to a vertical geometry than a tapered shape of the outer peripheral surface 273A of the low energy region 273 and a tapered shape of the outer peripheral surface 274A of the medium energy region 274 (in other words, the angles $\theta_5$ and $\theta_7$ are close to 90 degrees) (i.e., the difference between the diameters of both ends of the respective openings 56 and the difference between the diameters of both ends of the respective openings 65 can be reduced), and hence the openings 56 and 65 can be reduced in terms of a diameter.

The openings 56 and 65 are generated by exposing the insulation layers 28 and 43 to the laser 271 (see FIG. 3) by way of the support films 74 while the support films 74 remain affixed to the insulation layers 28 and 43, thereby preventing adhesion of debris to the surfaces 28A and 43A of the insulation layers 28 and 43, which would otherwise arise during laser processing (e.g., chips of the insulation layers 28 and 43). Hence, the electronic component connection pads 31 or the external connection pads 46 can be generated with superior accuracy on the surfaces 28A and 43A of the insulation layers 28 and 43.

When the depth of the openings 56 and 65 is 30 μm and when the diameter of the ends of the openings 56 and 65 to be exposed to the laser 271 is 60 μm, the diameter of the other ends of the respective openings 56 and 65 can be set to; for instance, 55 μm.

Figure 14:
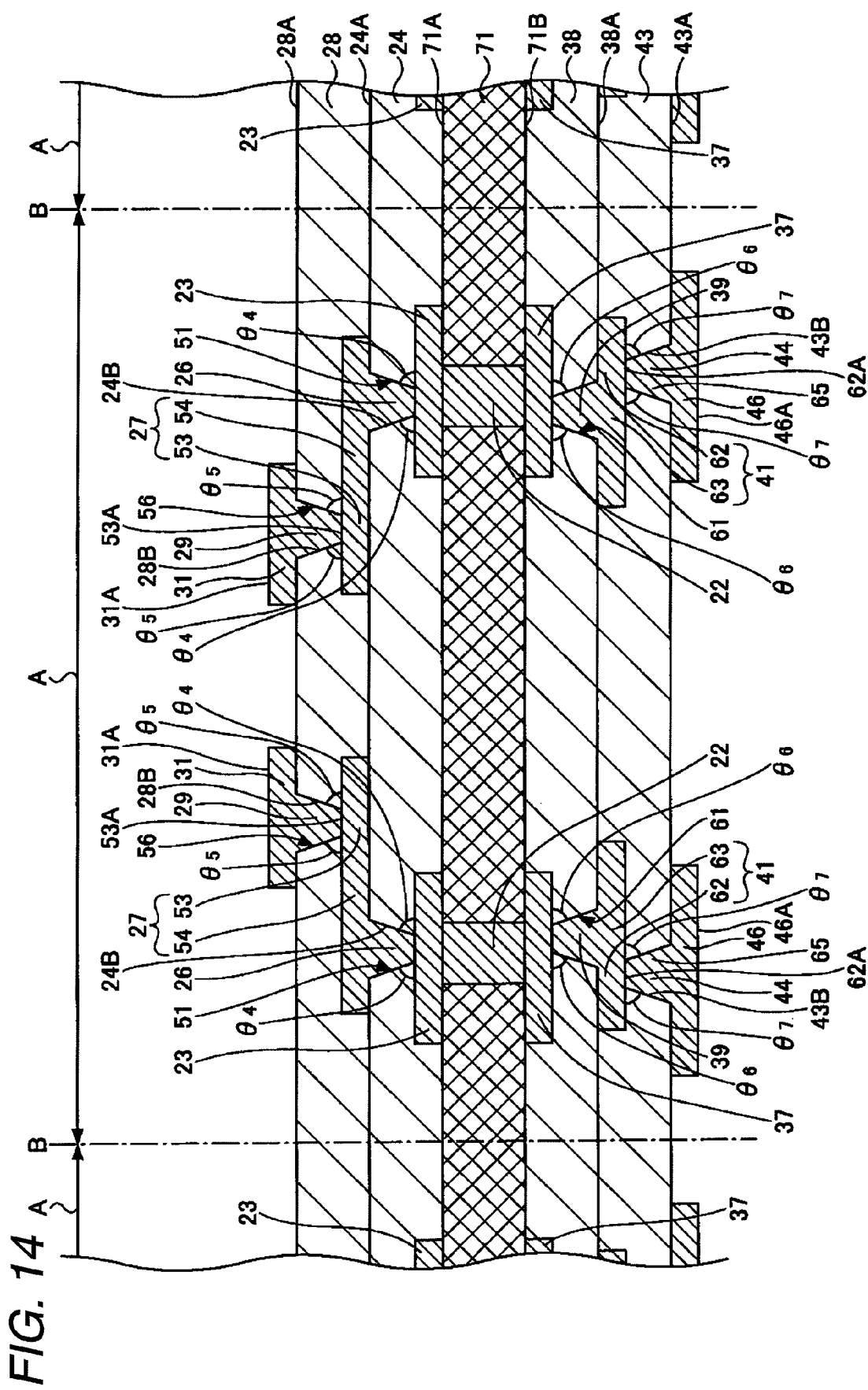
FIG. 14 is a view (part 9) showing the process for manufacturing the wiring board of the first embodiment of the present invention.

Next, processing similar to that pertaining to the previously-described process shown in FIG. 12 is performed in a process shown in FIG. 14, whereby the vias 29 and 44, the electronic component connection pads 31, and the external connection pads 46 are generated simultaneously.

Figure 15:
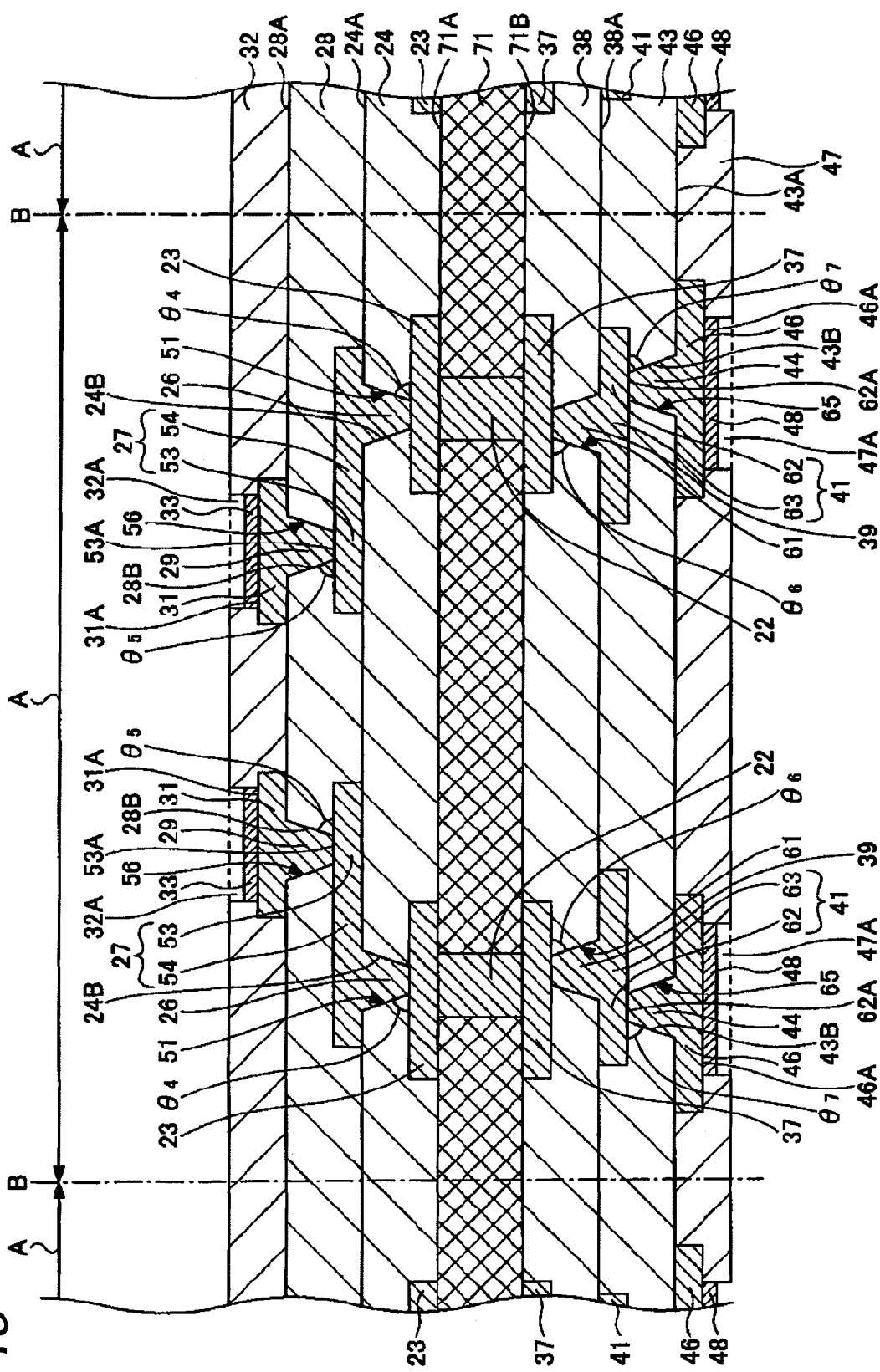
FIG. 15 is a view (part 10) showing the process for manufacturing the wiring board of the first embodiment of the present invention.

The solder resist 32 having the openings 32A, the solder resist 47 having the openings 47A, and the diffusion prevention films 33 and 48 are generated in a process shown in FIG. 15 by means of a known technique. As a result, structures corresponding to the wiring boards 10 are generated in the plurality of wiring board generation regions A, respectively. For instance, a Ni/Au multilayer film made by stacking in sequence a Ni layer and an Au layer; a Ni/Pd/Au multilayer film made by stacking in sequence a Ni layer, a Pd layer, and an Au layer; a Pd/Au multilayer film made by stacking in sequence a Pd layer and an Au layer; an Au layer; and the like, can be used as the diffusion prevention films 33 and 48. When the Ni/Pd/Au multilayer film is used as the diffusion prevention films 33 and 48, a Ni/Pd/Au multilayer film is generated by means of stacking in sequence a Ni layer (having a thickness of; for instance, 3 μm or more), a Pd layer (having a thickness of; for instance, 0.1 μm or less), and an Au layer (having a thickness of; for instance, 0.01 μm to 0.5 μm) by means of; for example, electroless plating.

Figure 16:
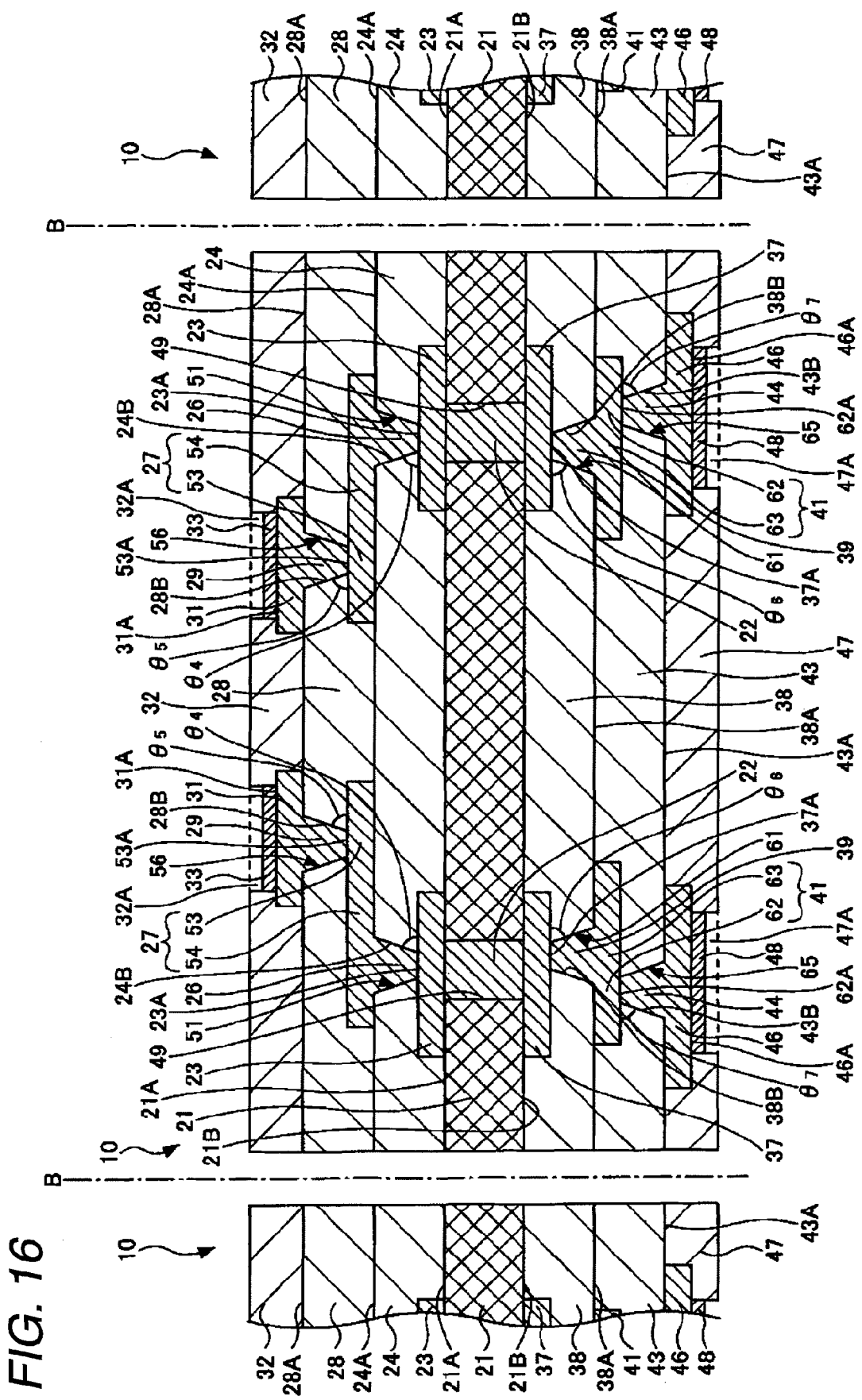
FIG. 16 is a view (part 11) showing the process for manufacturing the wiring board of the first embodiment of the present invention.

In a process shown in FIG. 16, the structure shown in FIG. 15 is cut along the cut lines B, whereby the plurality of wiring board 10 are separated into pieces.

According to the method for manufacturing a wiring board of the present embodiment, there is prepared the insulation layer generation member 73 having the support films 74 and the insulation layers 75 that are provided on the surfaces 74A of the respective support films 74 and that are semi-cured. The insulation layer generation member 73 is affixed to the pads 23, 37, 53, and 62 such that the pads 23, 37, 53, and 62 contact the semi-cured insulation layers 75. Next, the semi-cured insulation layers 75 are cured, to thus generate the insulation layers 24, 28, 38, and 43. Subsequently, the cured insulation layers 24, 28, 38, and 43 are exposed to the laser 271 by way of the support films 74, thereby opening the openings 51, 56, 61, and 65. Thereby, the support films 74 block the portion of the laser 271 corresponding to the low energy region 273 that is located at an outer region of the laser 271 and has low energy intensity and the portion of the laser 271 corresponding to the medium energy region 274 that is lower than the high energy region 272 and higher than the low energy region 273 in terms of energy intensity. Hence, exposure of the insulation layers 24, 28, 38, and 43 to the portions of the laser 271 corresponding to the low energy region 273 and the medium energy region 274 is prevented. As a consequence, the openings 51, 56, 61, and 65 whose side surfaces are close in shape to a vertical geometry can be opened in the insulation layers 24, 28, 38, and 43 by use of the portion of the laser 271 corresponding to the high energy region 272 having the outer peripheral surface 272A whose shape is close to the vertical geometry than the tapered shape of the outer peripheral surface 273A of the low energy region 273 and the tapered shape of the outer peripheral surface 274A of the medium energy region 274 (in other words, the angles $\theta_4$, $\theta_5$, $\theta_6$, and $\theta_7$ are close to 90 degrees) (the difference between the diameters of both ends of the respective openings 51, the difference between the diameters of both ends of the respective openings 56, the difference between the diameters of both ends of the respective openings 61, and the difference between the diameters of both ends of the respective openings 65 can be reduced), and hence the openings 51, 56, 61, and 65 can be reduced in terms of a diameter.

(Second Embodiment)

Figure 18:
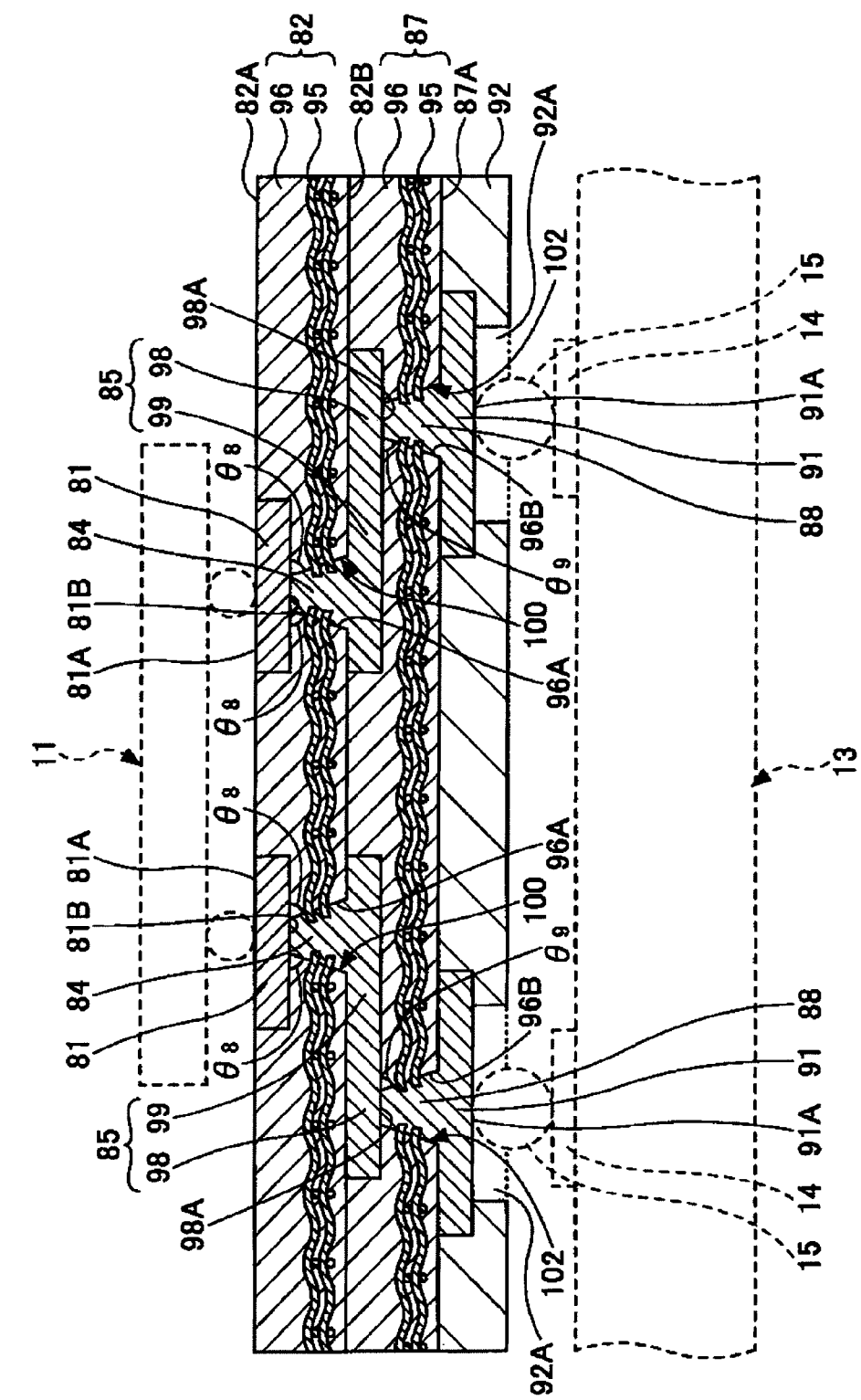
FIG. 18 is a cross-sectional view of a wiring board of a second embodiment of the present invention.
Figure 19:
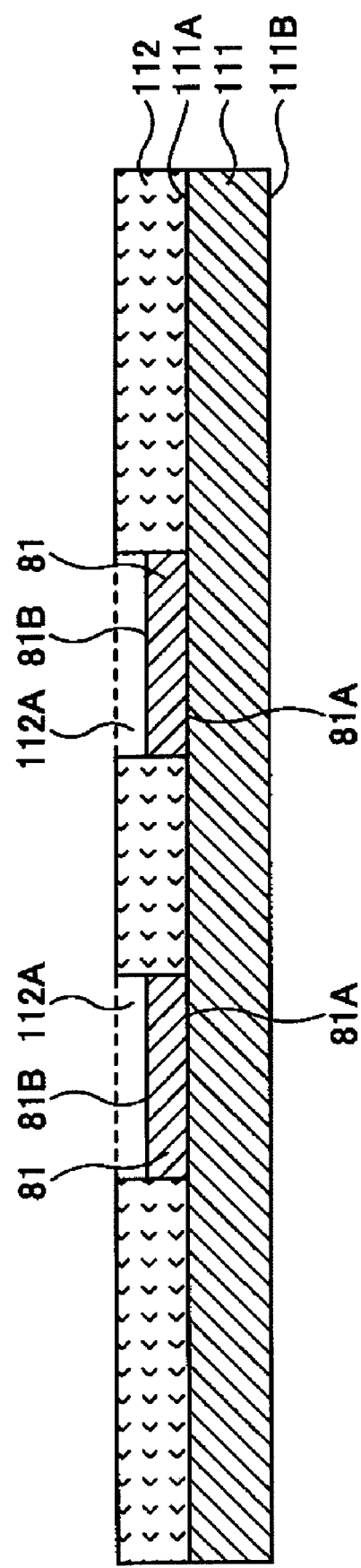
FIG. 19 is a view (part 1) showing a process for manufacturing the wiring board of the second embodiment of the present invention.
Figure 20:
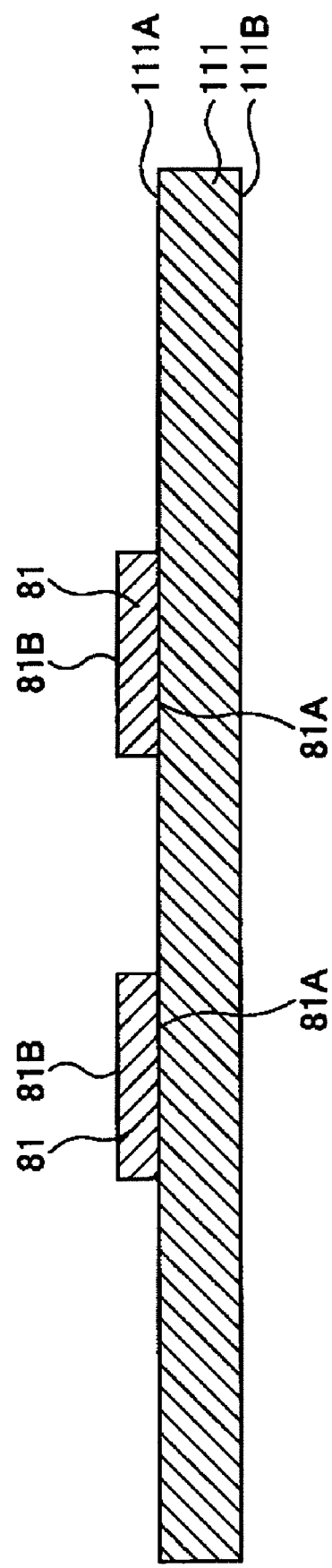
FIG. 20 is a view (part 2) showing the process for manufacturing the wiring board of the second embodiment of the present invention.

FIG. 18 is a cross-sectional view of a wiring board of a second embodiment of the present invention. In FIG. 18, constituent elements which are the same as those of the structure shown in FIG. 5 described in connection with the first embodiment are assigned the same reference numerals.

By reference to FIG. 18, a wiring board 80 of the second embodiment is a coreless substrate. The wiring board 80 has electronic component connection pads 81, insulation layers 82 and 87, vias 84 and 88, wiring patterns 85, external connection pads 91, and a solder resist 92.

Each of the electronic component connection pads 81 has a connection surface 81A on which the electronic component 11 is to be mounted (connected). The electronic component connection pads 81 are embedded in the insulation layer 82 (specifically a resin layer 96 that constitutes the insulation layer 82 and that will be described later) such that the connection surfaces 81A become essentially flush with surfaces 82A of the insulation layer 82 (surfaces opposite to surfaces 82B that contact the insulation layer 87). For instance, an Au/Pd/Ni multilayer film made by stacking, in sequence from the connection surface 81A, an Au layer (having a thickness of; for instance, 0.05 μm); a Pd layer (having a thickness of; for instance, 0.05 μm); and a Ni layer (having a thickness of; for instance, 5 μm) can be used as the electronic component connection pads 81. In this case, the electronic component 11 is mounted on the Au layer.

Figure 2:
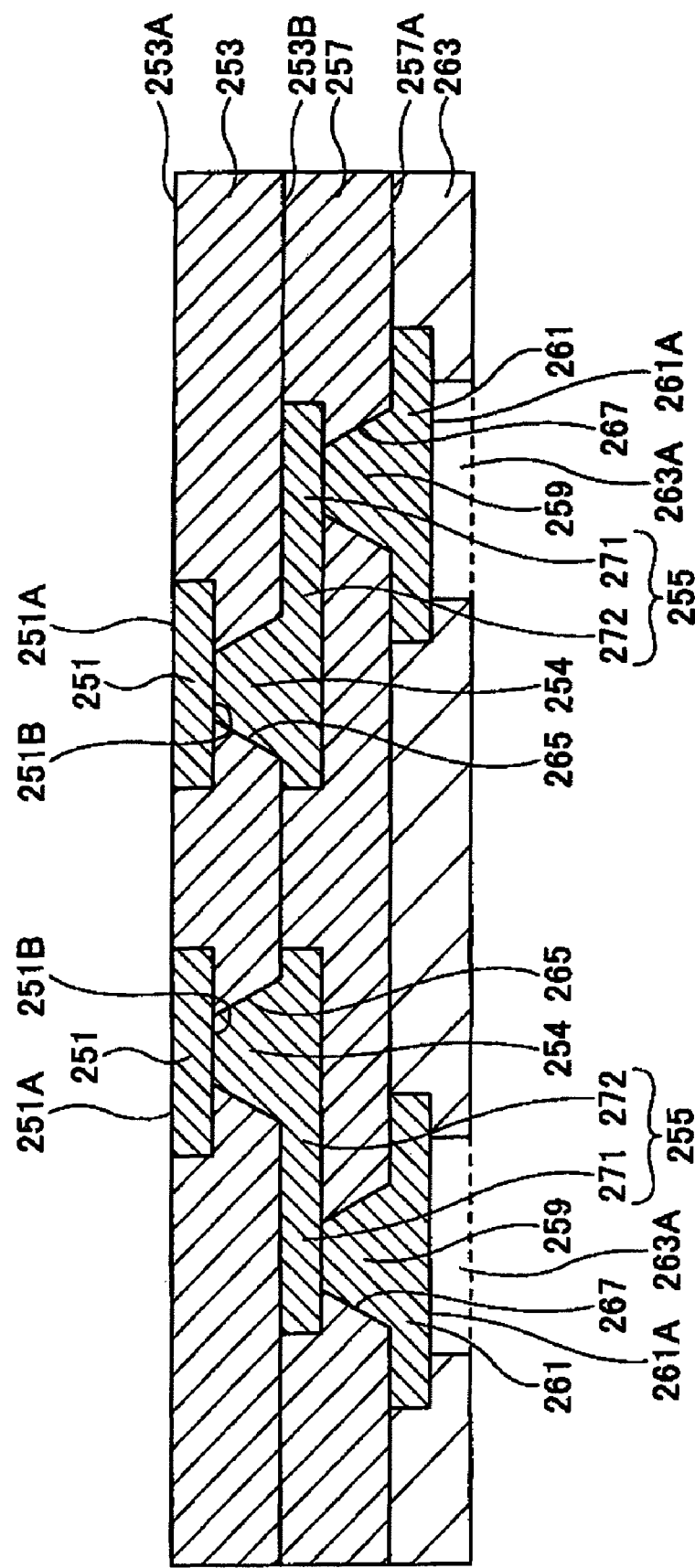
FIG. 2 is a cross-sectional view of another related-art wiring board.

The insulation layer 82 has a core material 95 and the cured resin layer 96 that covers the core material 95. The surface 82A of the insulation layer 82 is essentially flush with the connection surfaces 81 A of the electronic component connection pads 81. The insulation layer 82 has openings 100 through which surfaces 81 B of the electronic component connection pads 81 (surfaces of the electronic component connection pads 81 on the opposite side of the connection surfaces 81 A) are exposed. The openings 100 are opened so as to penetrate through areas of the insulation layer 82 opposing the surfaces 81 B of the electronic component connection pads 81 (specifically the core material 95 and the resin layer 96). The openings 100 are opened by exposing a surface 82B of the insulation layer 82 (the surface of the insulation layer 82 on the opposite side of the surface 82A) to laser. The openings 100 are opened in such a way that a difference between the diameter of one end of an opening and the diameter of the other end of the same becomes smaller than a difference between the diameter of one end of the opening 256 (see FIG. 2) provided in the related-art wiring board 250 and the diameter of the other end of the same. In short, the openings 100 are configured such that an angle $\theta_8$ which a surface 96A of the resin layer 96 corresponding to the side surface of the opening 100 forms with the surface 81B of the electronic component connection pad 81 becomes close to an angle of 90 degrees. The thickness of the insulation layers 82 can be set to; for instance, 55 μm. In this case, the depth of the opening 100 can be set to 40 μm. When the depth of the opening 100 is 40 μm and when the diameter of the end of the opening 100 to be exposed to the laser is 60 μm, the diameter of the end of the opening 100 located on the same side where the electronic component connection pads 81 are located can be set to; for instance, 45 μm.

The core material 95 is covered with the cured resin layer 96. When compared with the resin layer 96, the core material 95 is less likely to be processed by laser and, hence, projects to the inside of each of the openings 100. The core material 95 is a member for reducing warpage in the wiring board 80 serving as a coreless board by means of reinforcing the intensity of the insulation layer 82. For example, a woven fabric or unwoven fabric of glass fiber, a woven or unwoven fabric of aramid fiber, or the like, can be used as the core material 95. Fiber other than the fabrics mentioned above may also be used as the core material 95.

The resin layer 96 covers portions of side surfaces and the surfaces 81B of the electronic component connection pads 81. For instance, a resin layer not including a filler such as silica particles, a resin layer containing a filler such as silica particles, and the like, can be used as the resin layer 96. When compared with the case where a resin layer not including silica particles is used, using; for instance, a resin layer containing silica particles, as the resin layer 96 enables a reduction in difference between a coefficient of thermal expansion of the insulation layer 82 and a coefficient of thermal expansion of the electronic component 11 (e.g., a semiconductor chip) mounted on the electronic component connection pads 81.

In addition to silica particles, alumina particles, silicon carbide particles, and the like, may also be used as a filler which will constitute the insulation layer 82. For instance, an epoxy resin having a thermosetting characteristic, a thermosetting polyolefin-based resin, and the like, can be used as a material for a resin layer 96. A resin other than those mentioned above may also be used as a material for the resin layer 96.

The vias 84 are provided in the respective openings 100 opened in the insulation layer 82. The vias 84 are connected at single ends thereof to the electronic component connection pads 81, and the other ends of the vias are generated integrally with the wiring patterns 85. The vias 84 hereby electrically connect the electronic component connection pads 81 to the wiring patterns 85.

Each of the wiring patterns 85 has a pad 98 and a wiring 99. The pads 98 are provided on the surface 82B of the insulation layer 82. The pads 98 are configured integrally with the wirings 99. The pads 98 are electrically connected to the vias 84 by way of the wirings 99. The respective wirings 99 are provided on the other ends of the vias 84 and the surface 82B of the insulation layer 82. The wirings 99 are configured integrally with the vias 84 and the pads 98. For instance, Cu can be used as a material for the vias 84 and the wiring patterns 85. The vias 84 and the wiring patterns 85 can be generated by means of; for instance, a semi-additive process.

The insulation layer 87 has the core material 95 and the cured resin layer 96 that covers the core material 95. The insulation layer 87 is provided on the surface 82B of the insulation layer 82 so as to cover the wirings 99. The insulation layer 87 has openings 102 through which surfaces 98A of pads 98 are exposed. The openings 102 are opened so as to penetrate through areas of the insulation layer 87 opposing the surfaces 98A of the pads 98 (specifically the core material 95 and the resin layer 96). The openings 102 are opened by exposing a surface 87A of the insulation layer 87 (the surface of the insulation layer 87 on the opposite side of the surface that contacts the insulation layer 82) to laser. The openings 102 are opened in such a way that a difference between the diameter of one end of an opening and the diameter of the other end of the same becomes smaller than a difference between the diameter of one end of the opening 267 (see FIG. 2) provided in the related-art wiring board 250 and the diameter of the other end of the same. In short, the openings 102 are configured such that an angle $\theta_9$ which a surface 96B of the resin layer 96 corresponding to the side surface of the opening 102 forms with the surface 98A of the pad 98 becomes close to an angle of 90 degrees. The thickness of the insulation layers 87 can be set to; for instance, 55 µm. In this case, the depth of the opening 102 can be set to 40 µm. When the depth of the opening 102 is 40 µm and when the diameter of the end of the opening 102 to be exposed to the laser is 60 µm, the diameter of the end of the opening 102 located on the same side where the external connection pads 91 are located can be set to; for instance, 45 µm.

The core material 95 is covered with the cured resin layer 96. When compared with the resin layer 96, the core material 95 is less likely to be processed by laser and, hence, projects to the inside of each of the openings 102. The core material 95 is a member for reducing warpage in the wiring board 80 serving as a coreless board by means of reinforcing the intensity of the insulation layer 87. For example, a woven fabric or unwoven fabric of glass fiber, a woven or unwoven fabric of aramid fiber, or the like, can be used as the core material 95. Fiber other than the fabrics mentioned above may also be used as the core material 95.

The resin layer 96 is provided on the surface 82B of the insulation layer 82 so as to cover the wirings 99. For instance, a resin layer not including a filler such as silica particles, a resin layer containing a filler such as silica particles, and the like, can be used as the resin layer 96. When compared with the case where a resin layer not including silica particles is used, using; for instance, a resin layer containing silica particles, as the resin layer 96 enables a reduction in difference between a coefficient of thermal expansion of the insulation layer 87 and a coefficient of thermal expansion of the electronic component 11 (e.g., a semiconductor chip) mounted on the electronic component connection pads 81.

In addition to silica particles, alumina particles, silicon carbide particles, and the like, may also be used as a filler which will constitute the insulation layer 87. For instance, an epoxy resin having a thermosetting characteristic, a thermosetting polyolefin-based resin, and the like, can be used as a material for a resin layer 96. A resin other than those mentioned above may also be used as a material for the resin layer 96.

The vias 88 are provided in the respective openings 102 opened in the insulation layer 87. The vias 88 are connected at single ends thereof to the pads 98, and the other ends of the vias are generated integrally with the external connection pads 91. The vias 88 hereby electrically connect the pads 98 to the external connection pads 91.

The external connection pads 91 are provided on the surface 87A of the insulation layer 87 (the surface of the insulation layer 87 on the opposite side of the surface that contacts the insulation layer 82) and configured integrally with the vias 88. Each of the external connection pads 91 has a terminal arrangement surface 91A on which the external connection terminal 15 is to be arranged. The external connection pads 91 are pads which are electrically connected to the mount substrate 13, such as a mother board, by way of the external connection terminal 15. For instance, Cu can be used as a material for the vias 88 and the external connection pads 91. The vias 88 and the external connection pads 91 can be generated by means of; for instance, a semi-additive process.

A solder resist 92 is provided on the surface 87A of the insulation layer 87 so as to cover the external connection pads 91 except their terminal arrangement surfaces 91A. The solder resist 92 has openings 92A through which the terminal arrangement surfaces 91A of the external connection pads 91 are exposed.

FIGS. 19 through 30 are views showing processes for manufacturing the wiring board of the second embodiment of the present invention. In FIGS. 19 through 30, constituent elements which are the same as those of the wiring board 80 of the second embodiment are assigned the same reference numerals.

By reference to FIGS. 19 through 30, the method for manufacturing the wiring board 80 of the second embodiment will be described. First, in a process shown in FIG. 19, a resist film 112 having openings 112A is formed on a surface 111A of a support 111, wherein portions of the surface 111A of the conductive support 111 corresponding to areas where electronic component connection pads 81 are to be generated are exposed through the openings 112A. Next, the electronic component connection pads 81 are generated on the areas of the surface 111A of the support 111 exposed through the openings 112A by means of an electrolytic plating process using the support 111 as a feed layer. Specifically, for instance, when an Au/Pd/Ni multilayer film is used as the electronic component connection pads 81, the electronic component connection pads 81 are generated through sequential deposition growth of an Au layer (having a thickness of; for instance, 0.05 µm), a Pd layer (having a thickness of; for instance, 0.05 µm), and a Ni layer (having a thickness of; for instance, 5 µm) by means of an electrolytic plating process after formation of the resist film 112 having the openings 112A. For instance, a metal foil (e.g., a Cu foil), a metal plate (e.g., a Cu plate), and the like, can be used as the support 111 having a conductive characteristic. In a subsequent process shown in FIG. 20, the resist film 112 is removed.

Figure 21:
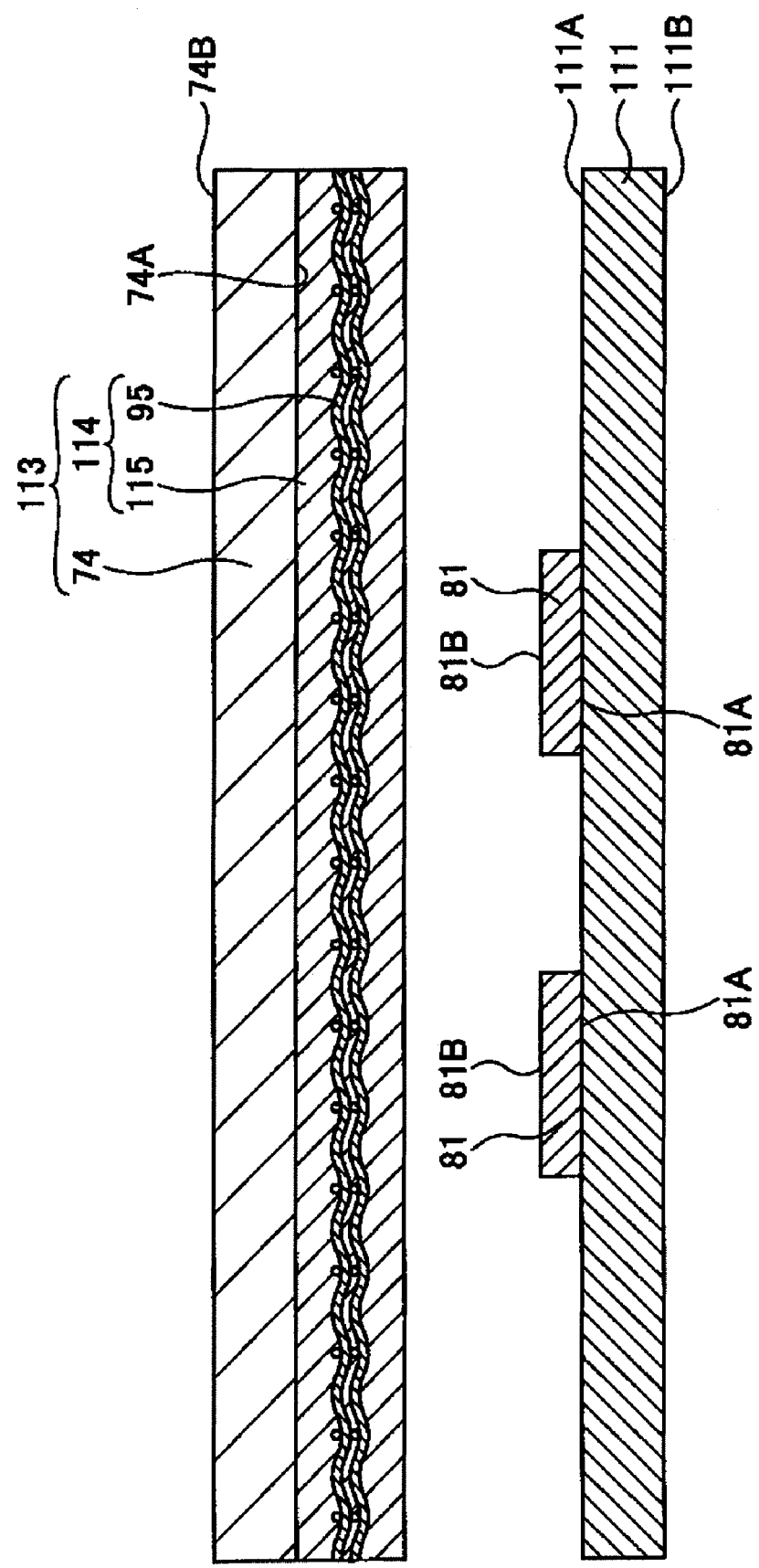
FIG. 21 is a view (part 3) showing the process for manufacturing the wiring board of the second embodiment of the present invention.

In a process shown in FIG. 21, there is prepared an insulation layer generation member 113 having the support film 74 and an insulation layer 114 that is provided on the surface 74A (one surface) of the support film 74 and that is in a semi-cured state (an insulation layer generation member preparation step). The support film 74 is a film for supporting the insulation layer 114. For instance, polyester such as PET (polyethylene terephthalate), polyethylene, polyolefin such as polyvinyl chloride, polycarbonate, and the like, can be used as a material for the support film 74. The thickness of the support film 74 can be set to; for instance, 30 µm to 40 µm.

The insulation layer 114 has the core material 95 and a semi-cured resin layer 115 that covers the core material 95. For example, a woven fabric or unwoven fabric of glass fiber, a woven or unwoven fabric of aramid fiber, or the like, can be used as the core material 95. Fiber other than the fabrics mentioned above may also be used as the core material 95. For instance, a semi-cured resin layer not including a filler such as silica particles, a semi-cured resin layer containing a filler such as silica particles, and the like, can be used as the semi-cured resin layer 115. In addition to silica particles, alumina particles, silicon carbide particles, and the like, may also be used as a filler which will constitute the insulation layer 114. An epoxy resin having a thermosetting characteristic, a thermosetting polyolefin-based resin, and the like, can be used as a material for the semi-cured resin layer 115. A resin other than those mentioned above may also be used as a material for the semi-cured resin layer 115. The thickness of the insulation layer 114 can be set to; for instance, 30 μm to 50 μm.

Figure 22:
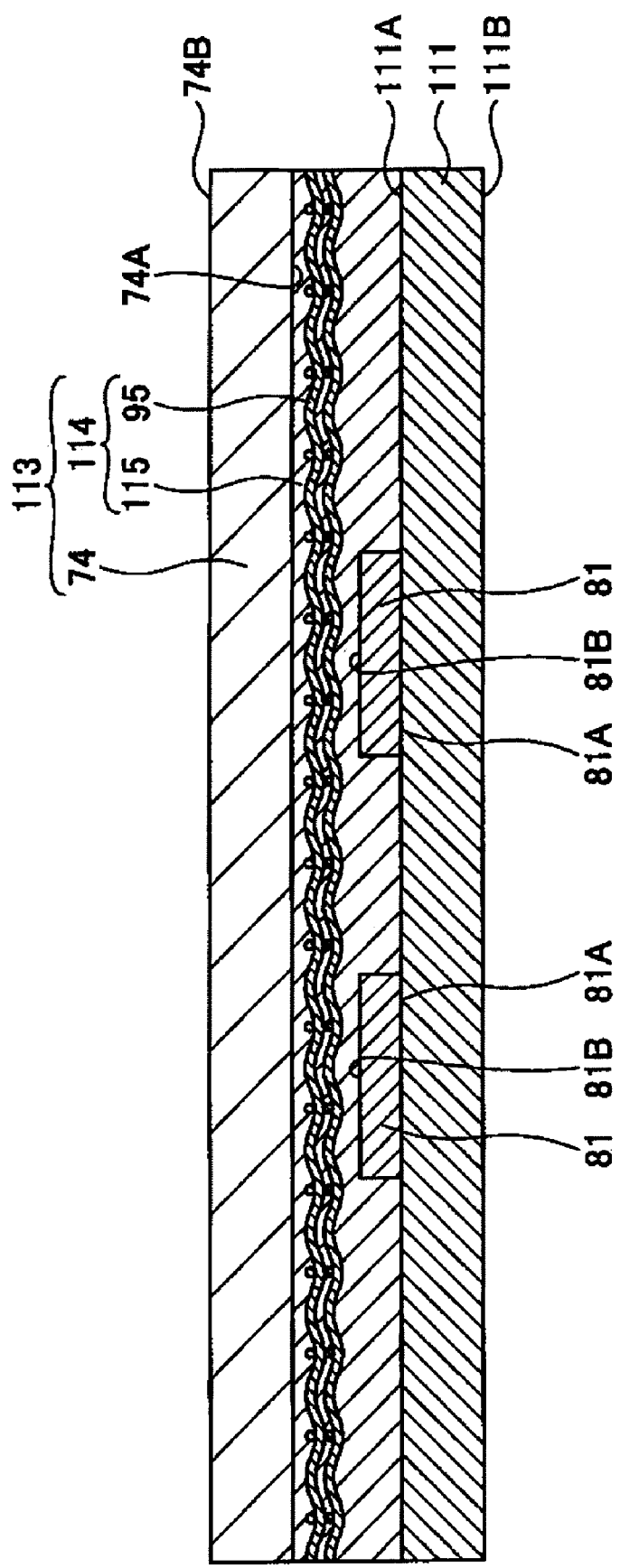
FIG. 22 is a view (part 4) showing the process for manufacturing the wiring board of the second embodiment of the present invention.

In a process shown in FIG. 22, the insulation layer generation member 113 is affixed to the surface 111A of the support 111 in such a manner that the electronic component connection pads 81 formed on the support 111 contact the semi-cured resin layer 115 (an insulation layer generation member affixing step). Specifically, the insulation layer generation member 113 is affixed to the surface 111A of the support 111 by means of; for instance, vacuum thermo-compression bonding. The semi-cured insulation layer 114 affixed to the surface 111A of the support 111 is a layer which will turn into the insulation layer 82 (see FIG. 18) as a result of being cured in a process shown in FIG. 23 to be described later.

Figure 23:
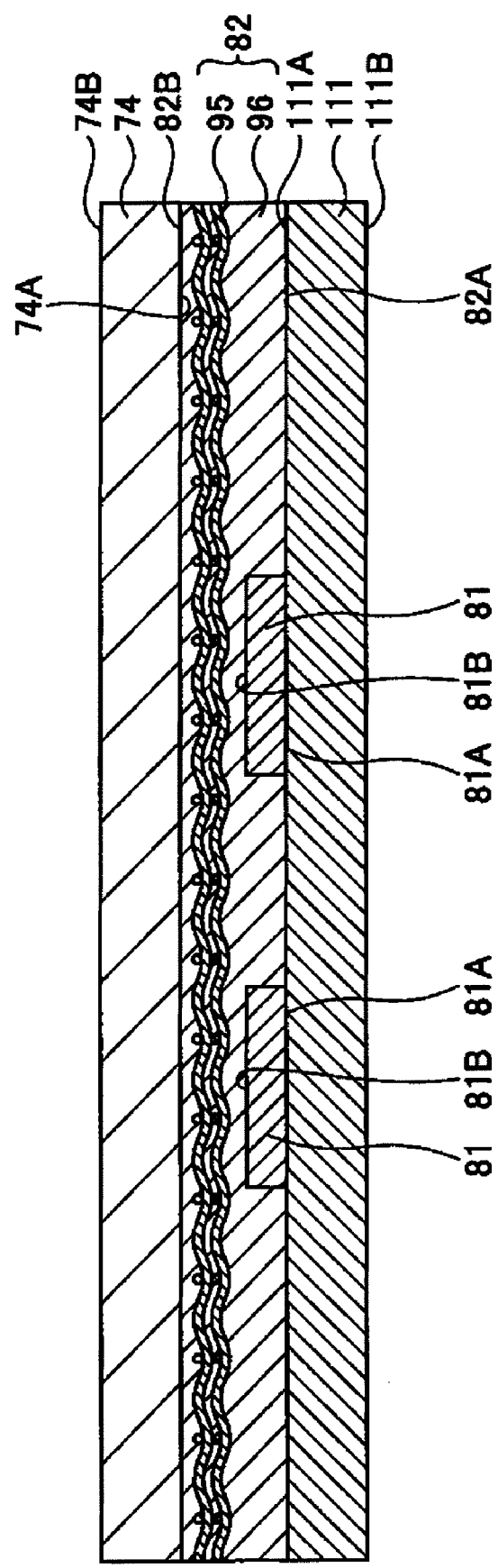
FIG. 23 is a view (part 5) showing the process for manufacturing the wiring board of the second embodiment of the present invention.

Next, the resin layers 115, which are semi-cured and shown in FIG. 22, are cured in the process shown in FIG. 23, thereby generating the resin layer 96 (an insulation layer curing step). As a result, the insulation layer 82 having the cured resin layer 96 on the surface 111A of the support 111 is generated.

Specifically, for instance, when the semi-cured resin layers 115 are formed from a thermosetting resin that serves as a base material, the structure shown in FIG. 22 is heated (at a heating temperature of; for instance, 180° C.), to thus generate the insulation layer 82 having the cured resin layer 96.

Figure 3:
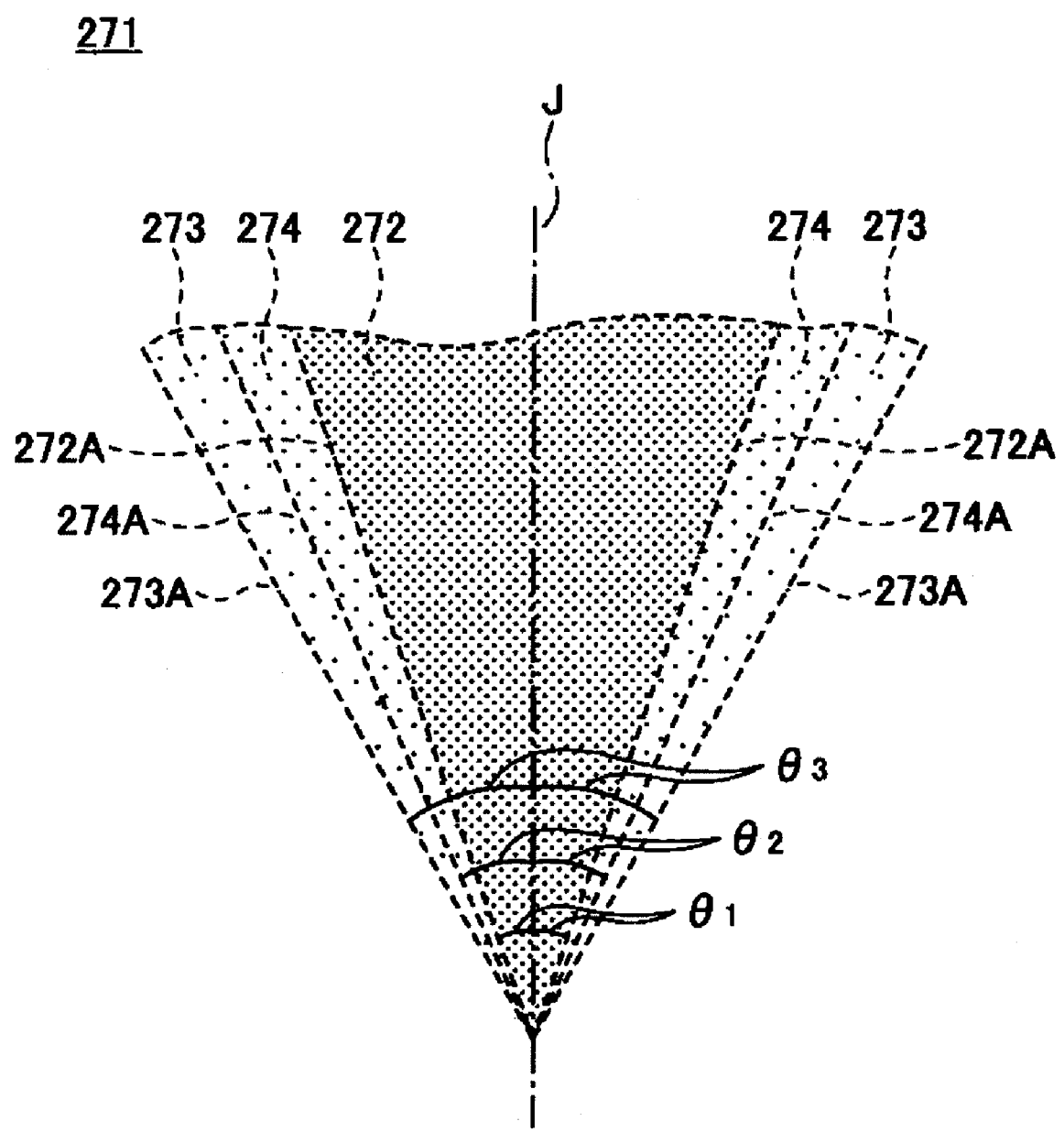
FIG. 3 is a view schematically showing a cross-sectional profile of laser used at the time of generation of openings in insulation layers.
Figure 4:
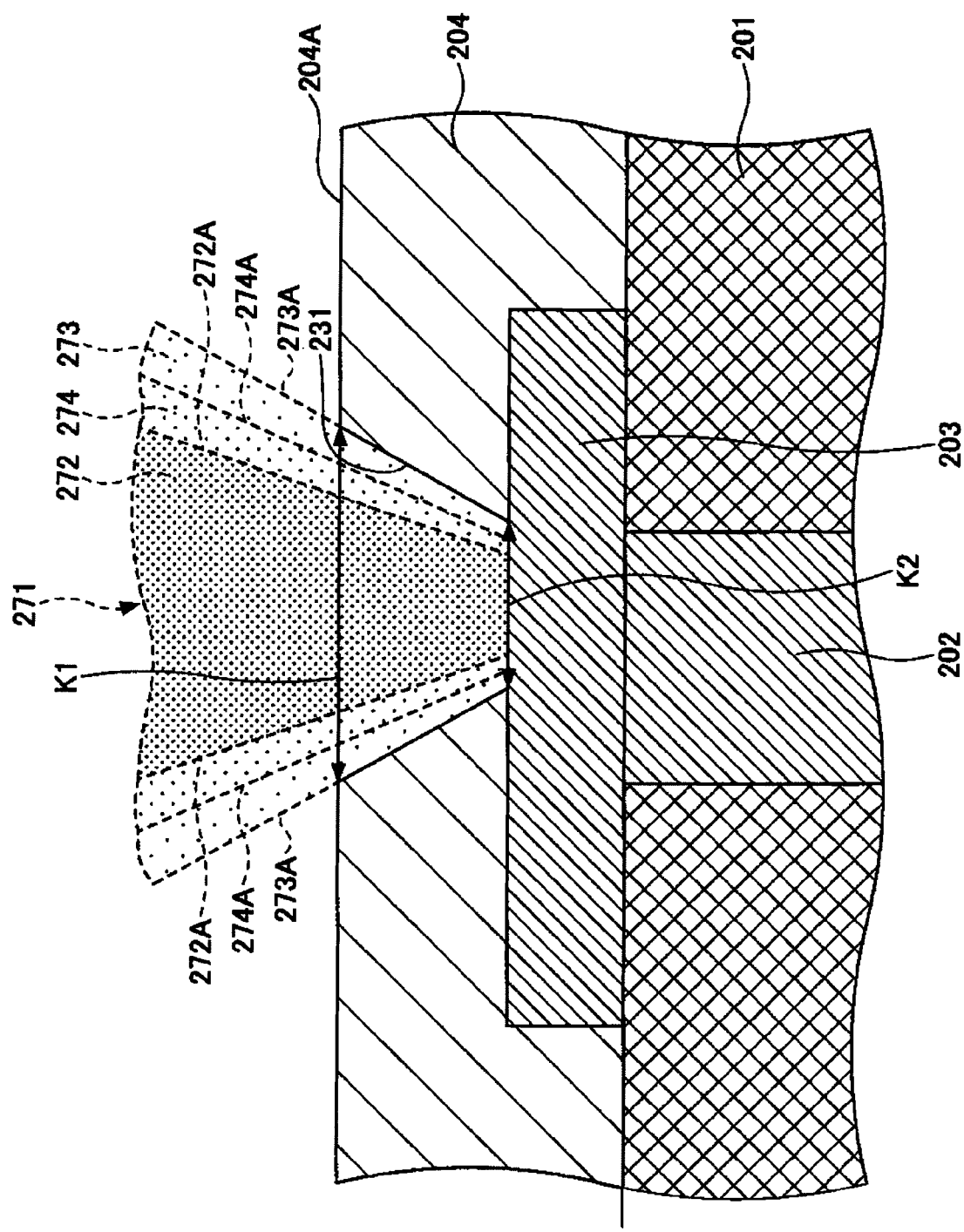
FIG. 4 is a view for describing a drawback in a method for manufacturing a related-art wiring board.

Subsequently, in a process shown in FIG. 24, the cured insulation layer 82 is exposed to the laser 271 shown in FIG. 3 by way of the support film 74. Put another way, the surface 74B of the support film 74 (the surface of the support film 74 that is not in contact with the insulation layer 82) is exposed to the laser 271, to thus generate, in the insulation layer 82, the openings 100 through which the surfaces 81B of the electronic component connection pads 81 are partially exposed (an opening generation step).

Figure 31:
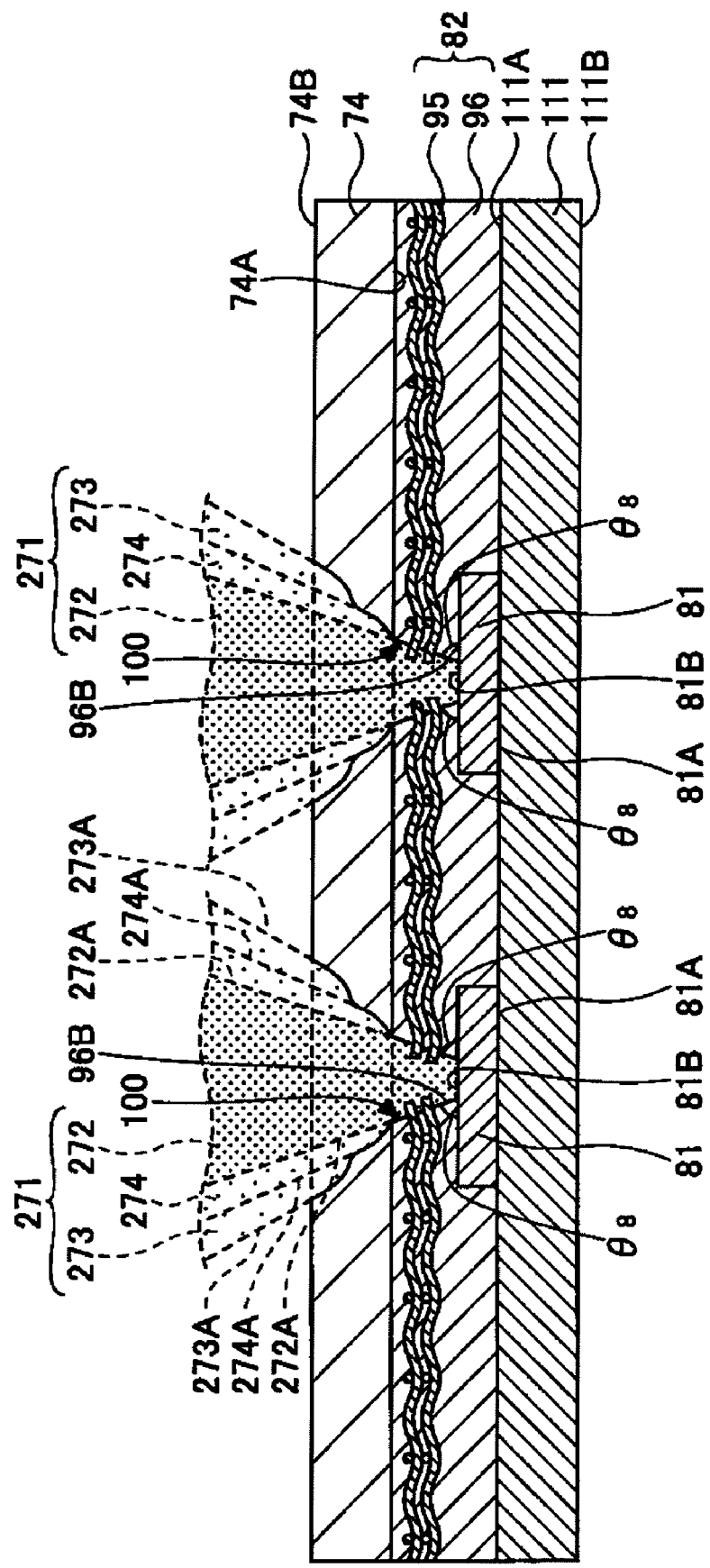
FIG. 31 is a view schematically showing a cross-sectional profile of laser radiated onto a support film and an insulation layer in the process for generating the openings.

FIG. 31 is a view schematically showing a cross-sectional profile of the support film and a cross-sectional profile of the laser radiated onto the insulation layer in the opening generation process. In FIG. 31, constituent elements which are the same as those of the laser 271 shown in previously-described FIG. 3 and the structure shown in FIG. 18 are assigned the same reference numerals.

There will now be described operation achieved in a case where the laser 271 (see FIG. 3) is radiated on the insulation layer 82 by way of the support film 74, thereby opening the openings 100.

As shown in FIG. 31, the laser 271 is radiated to the cured insulation layers 82 by way of the support film 74, to thus open the openings 100 in the insulation layer 82. As a result, the support film 74 can block the portion of the laser 271 corresponding to the low energy region 273 that is located at the outer region of the laser 271 and has low energy intensity and the portion of the laser 271 corresponding to the medium energy region 274 that is located inside of the low energy region 273 and that is lower than the high energy region 272, which is located in the center of laser and has high energy intensity, and higher than the low energy region 273 in terms of energy intensity.

As a result, the openings 100 having side surfaces whose shape is close to a vertical geometry can be opened by use of only the portion of the laser 271 corresponding to the high energy region 272 having the outer peripheral surface 272A whose shape is close to a vertical geometry than the tapered shape of the outer peripheral surface 273A of the low energy region 273 and the tapered shape of the outer peripheral surface 274A of the medium energy region 274 (in other words, the angle $\theta_8$ is close to 90 degrees) (i.e., the difference between the diameters of both ends of the respective opening 100 can be reduced), and hence the openings 100 can be reduced in terms of a diameter.

The openings 100 are opened by use of only the portion of the laser 271 corresponding to the high energy region 272, whereby the core material 95 becomes more easily processed as compared with the case of the related art. Hence, the extent to which the core material 95 projects into the openings 100 can be reduced as compared with the case of the related art. As a result, in a case where the vias 84 are generated by means of; for instance, plating, a sufficient amount of plating fluid can be supplied to the inside of the openings 100. Hence, the reliability of electrical connection between the electronic component connection pads 81 and the wiring patterns 85 can be enhanced.

The openings 100 are opened by exposing the insulation layers 82 to the laser 271 (see FIG. 3) by way of the support film 74 while the support film 74 remains affixed to the insulation layer 82, thereby preventing adhesion of debris to the surface 82B of the insulation layer 82, which would otherwise arise during laser processing (e.g., chips of the core material 95 and the resin layer 96). Hence, the wiring pattern 85 can be generated with superior accuracy on the surface 82B of the insulation layer 82.

When the depth of the openings 100 is 40 μm and when the diameter of the ends of the openings 100 to be exposed to the laser 271 is 60 μm, the diameter of the other ends of the respective openings 100 can be set to; for instance, 45 μm.

Figure 24:
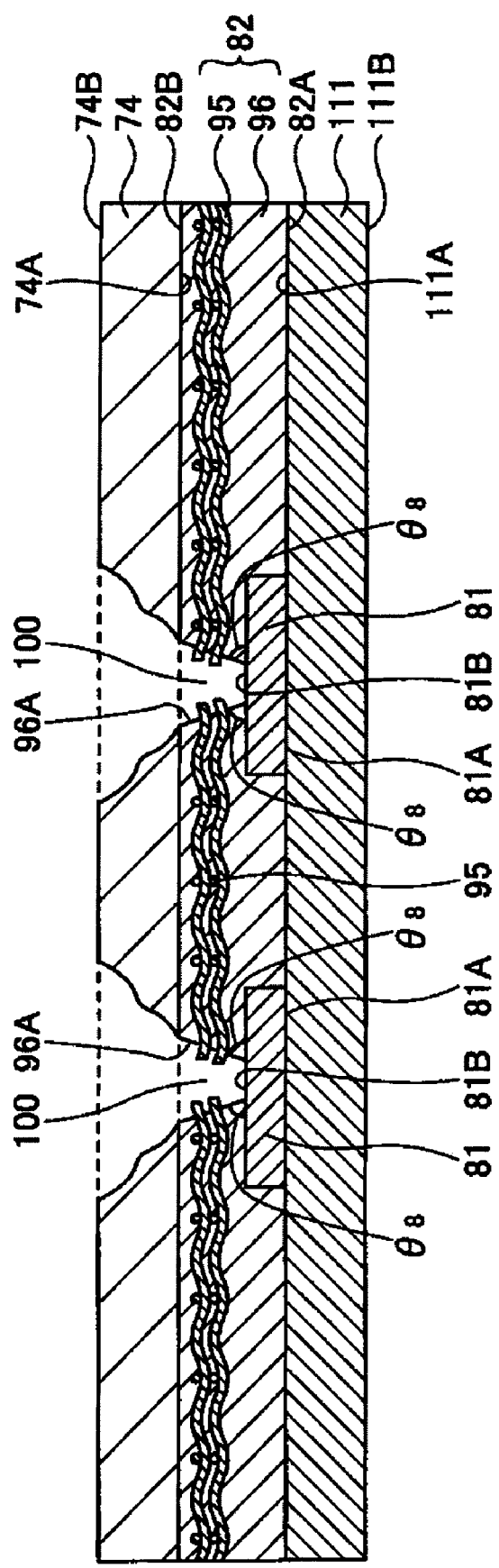
FIG. 24 is a view (part 6) showing the process for manufacturing the wiring board of the second embodiment of the present invention.
Figure 25:
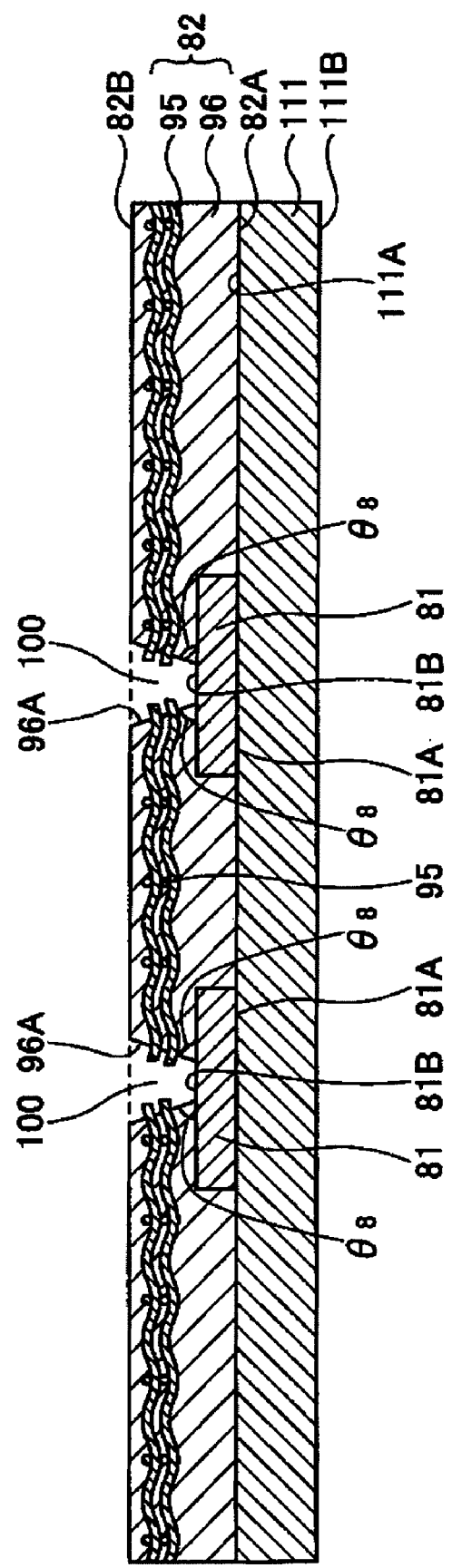
FIG. 25 is a view (part 7) showing the process for manufacturing the wiring board of the second embodiment of the present invention.

Next, the support film 74 provided on the structure shown in FIG. 24 is removed in a process shown in FIG. 25 (a support film removal step). Specifically, the support film 74 is striped from the insulation layer 82 in which the openings 100 are opened, thereby removing the support film 74.

Figure 26:
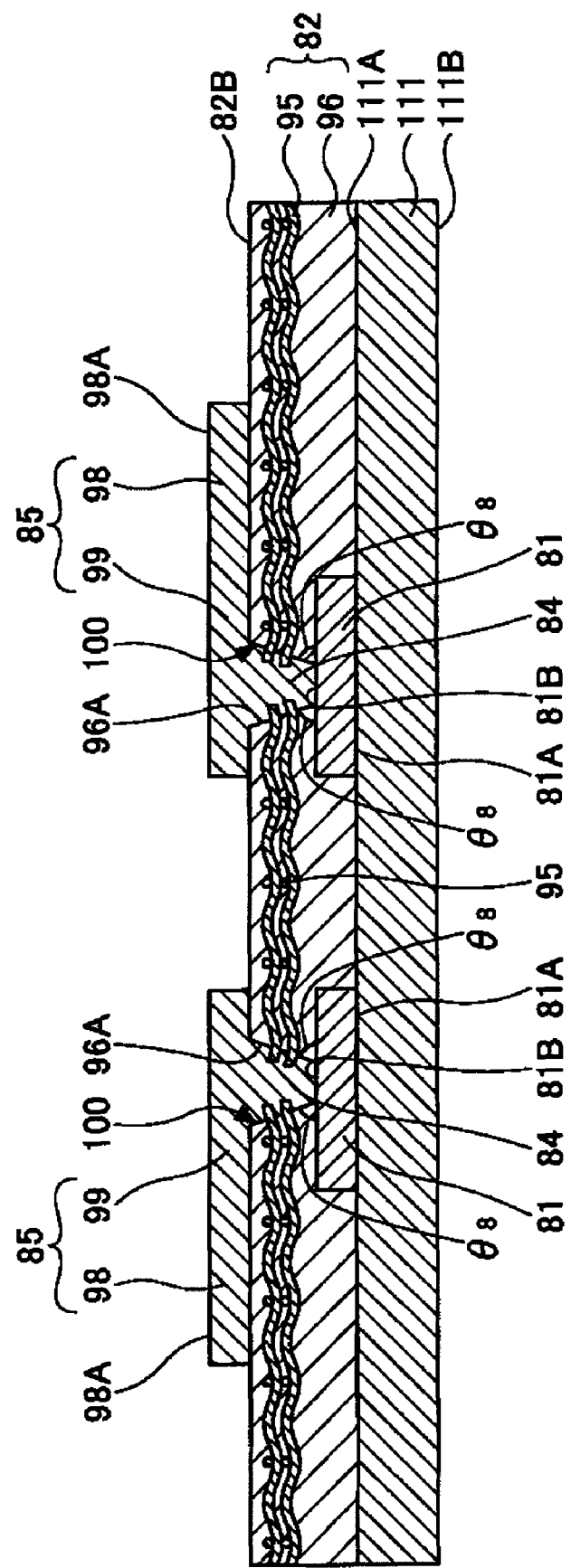
FIG. 26 is a view (part 8) showing the process for manufacturing the wiring board of the second embodiment of the present invention.

The vias 84 and the wiring patterns 85 are simultaneously generated in a process shown in FIG. 26 by means of a known technique (a via generation step). The vias 84 and the wiring patterns 85 can be generated by means of; for instance, a semi-additive process.

Specifically, in this case, the surface 82B of the insulation layer 82 and the surface 96A of the resin layer 96 are made coarse by means of a roughening process. Next, a seed layer (not shown) is produced so as to cover the surface 87A of the insulation layer 87 and the surface 96A of the resin layer 96, which have been roughened, and the surfaces 81B of the electronic component connection pads 81 exposed through the openings 100. Next, a resist film (not shown) having openings corresponding to areas where the wiring patterns 85 are to be generated is formed on the surface 82B of the insulation layer 82. By means of an electrolytic plating method that uses a seed layer as a feed layer, a plating film [e.g., a Cu plating film (having a thickness of; for instance, 15 μm)] is generated, through deposition growth, on areas of the seed layer exposed through the opening sections of the resist film. Subsequently, the resist film and an unwanted seed layer covered with the resist film are eliminated, thereby simultaneously generating the vias 84 and the wiring patterns 85. For instance, desmearing can be used as the roughening process. Moreover, a Cu layer (having a thickness of; for instance, 0.1 μm) generated by means of electroless plating or sputtering can be used as the seed layer.

It is better to remove the support film 74 immediately before generations of the vias 84. As mentioned above, as a result of removal of the support film 74 immediately before formation of the vias 84, adhesion of extraneous matters to the surface 82B of the insulation layer 82 or infliction of flaws in the insulation layer 82 can be prevented. Yields of the wiring board 80 can be hereby enhanced.

Figure 27:
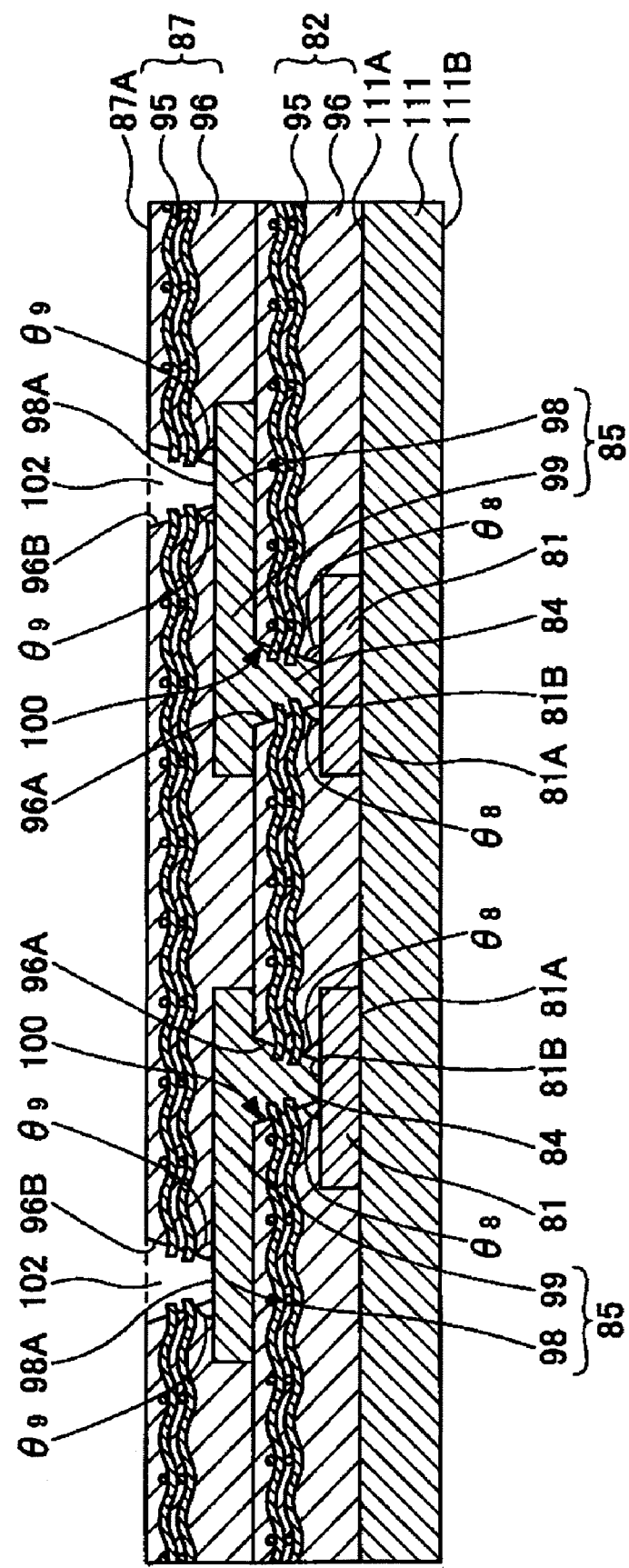
FIG. 27 is a view (part 9) showing the process for manufacturing the wiring board of the second embodiment of the present invention.

Next, processing similar to that pertaining to the previously-described processes shown in FIGS. 21 through 25 is performed in a process shown in FIG. 27, whereby the insulation layer 87 having the openings 102 are formed on the structure shown in FIG. 26.

Thus, the laser 271 is radiated to the cured insulation layer 87 by way of the support film 74, to thus open the openings 102 in the cured insulation layer 87. As a result, the support film 74 can block the portion of the laser 271 corresponding to the low energy region 273 that is located at the outer region of the laser 271 and has low energy intensity and the portion of the laser 271 corresponding to the medium energy region 274 that is lower than the high energy region 272 and higher than the low energy region 273 in terms of energy intensity.

As a result, the openings 102 having side surfaces whose shape is close to the vertical geometry can be opened by use of only the portion of the laser 271 corresponding to the high energy region 272 having the outer peripheral surface 272A whose shape is close to the vertical geometry than the tapered shape of the outer peripheral surface 273A of the low energy region 273 and the tapered shape of the outer peripheral surface 274A of the medium energy region 274 (in other words, the angles $\theta_8$ and $\theta_9$ are close to 90 degrees) (i.e., the difference between the diameters of both ends of the respective openings 102 can be reduced), and hence the openings 102 can be reduced in terms of a diameter.

The openings 102 are generated by exposing the insulation layer 87 to the laser 271 (see FIG. 3) by way of the support film 74 while the support film 74 remains affixed to the insulation layer 87, thereby preventing adhesion of debris to the surface 87A of the insulation layer 87, which would otherwise arise during laser processing (e.g., chips of the core material 95 and the resin layer 96). Hence, the external connection pads 91 can be generated with superior accuracy on the surface 87A of the insulation layer 87.

When the depth of the openings 102 is 40 μm and when the diameter of the ends of the openings 102 to be exposed to the laser 271 is 60 μm, the diameter of the other ends of the respective openings 102 can be set to; for instance, 45 μm.

Figure 28:
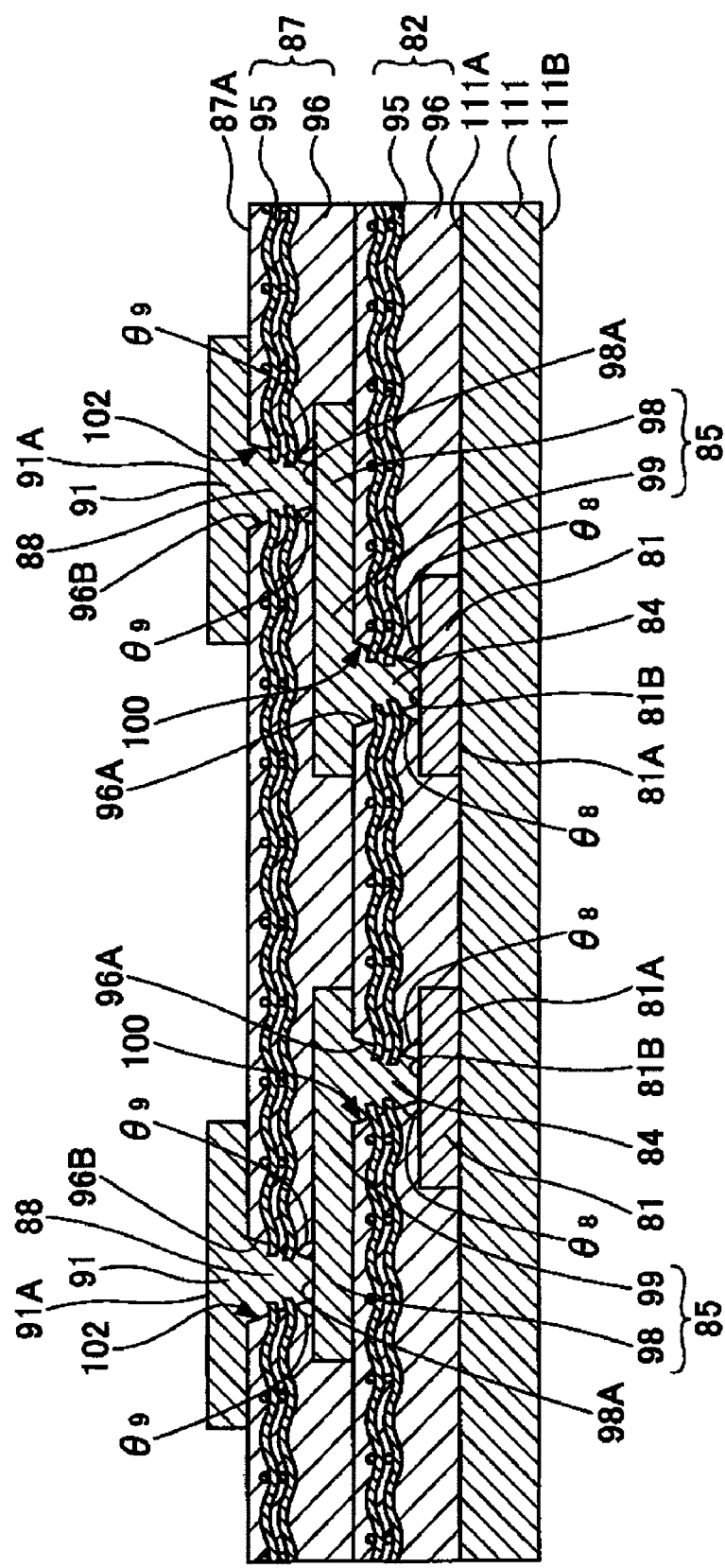
FIG. 28 is a view (part 10) showing the process for manufacturing the wiring board of the second embodiment of the present invention.
Figure 29:
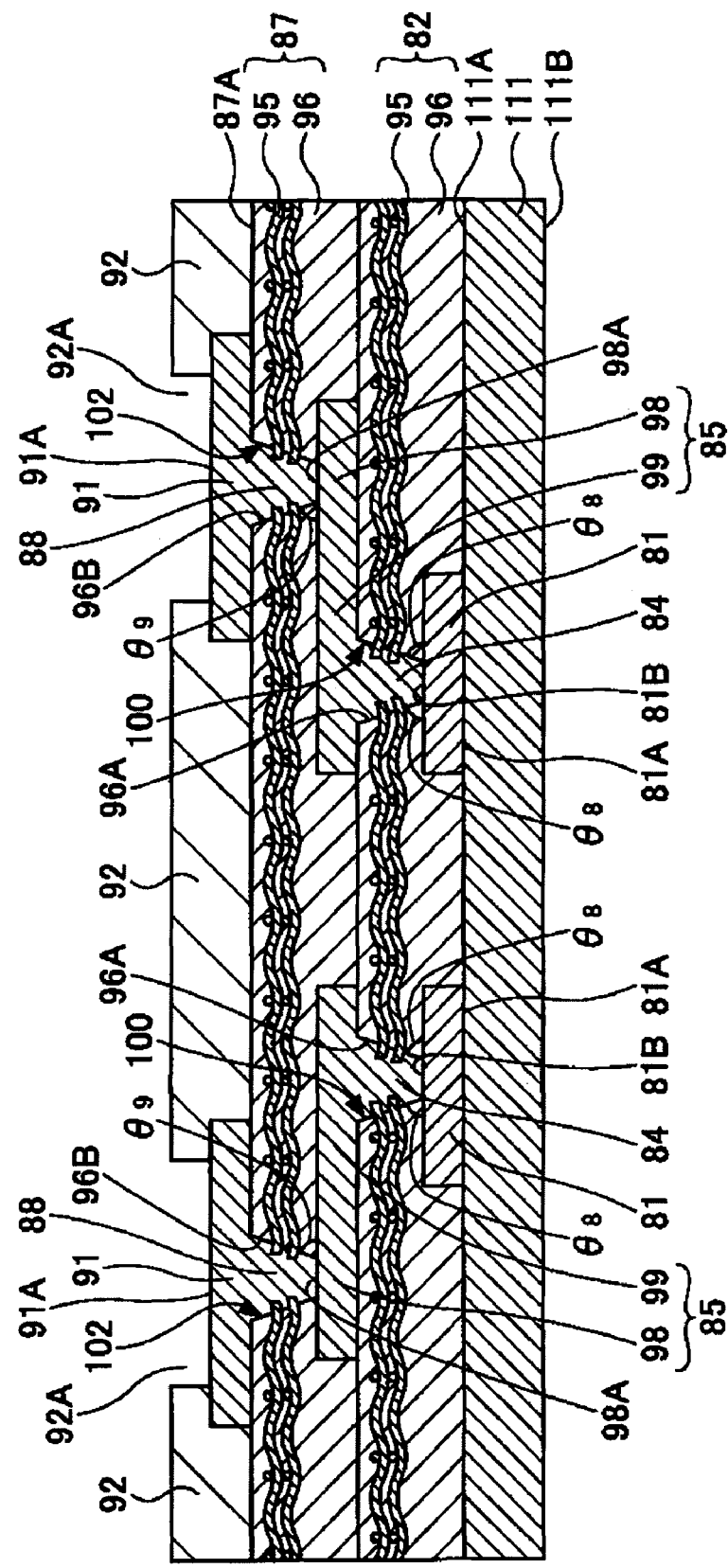
FIG. 29 is a view (part 11) showing the process for manufacturing the wiring board of the second embodiment of the present invention.

Next, processing similar to that pertaining to the previously-described process shown in FIG. 26 is performed in a process shown in FIG. 28, whereby the vias 88 and the external connection pads 91 are generated simultaneously. The solder resist 92 having the openings 92A through which the terminal arrangement surfaces 91A are exposed is generated on the surface 87A of the insulation layer 87 in a process shown in FIG. 29 by means of a known technique. As a result, a structure corresponding to the wiring board 80 is generated on the support 111. After generation of the solder resist 92, a Ni plating film and an Au plating film are sequentially stacked on the terminal arrangement surfaces 91A by means of electroless plating, to thus generate a Ni/Au multilayer film.

Figure 30:
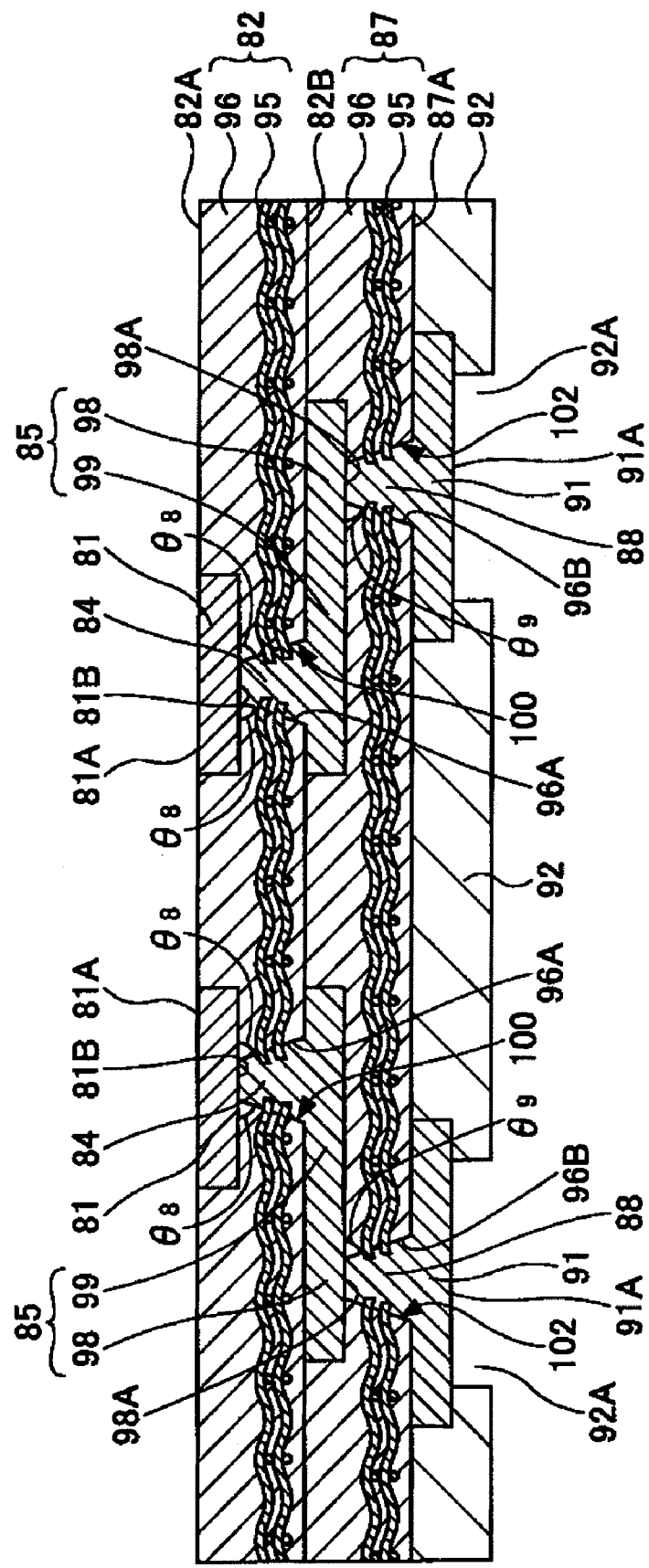
FIG. 30 is a view (part 12) showing the process for manufacturing the wiring board of the second embodiment of the present invention.

In a process shown in FIG. 30, the support 111 is removed. Specifically, when, for instance, a Cu foil or a Cu plate is used as the support 111, the support 111 is removed by means of etching. Thus, the wiring board 80 is fabricated. FIG. 30 shows, in a vertically-inverted manner, the structure shown in FIG. 29 from which the support 111 has been removed.

According to the method for manufacturing a wiring board of the present embodiment, there is prepared the insulation layer generation member 113 having the support film 74 and the insulation layer 114 that is provided on the surface 74A of the support film 74 and that is semi-cured. The insulation layer generation member 113 is affixed to the electronic component connection pads 81 or the pads 98 such that the electronic component connection pads 81 or the pads 98 contact the semi-cured insulation layer 114. Next, the semi-cured insulation layer 114 is cured, to thus generate the insulation layers 82 and 87. Subsequently, the insulation layers 82 and 87 are exposed to the laser 271 by way of the support film 74, thereby opening the openings 100 and 102. Thereby, the support film 74 can block the portion of the laser 271 corresponding to the low energy region 273 that is located at the outer region of the laser 271 and has low energy intensity and the portion of the laser 271 corresponding to the medium energy region 274 that is lower than the high energy region 272 and higher than the low energy region 273 in terms of energy intensity.

As a consequence, the openings 100 and 102 whose side surfaces are close in shape to the vertical geometry can be opened in the insulation layers 82 and 87 by use of only the portion of the laser 271 corresponding to the high energy region 272 having the outer peripheral surface 272A whose shape is close to the vertical geometry than the tapered shape of the outer peripheral surface 273A of the low energy region 273 and the tapered shape of the outer peripheral surface 274A of the medium energy region 274 (in other words, the angles $\theta_8$ and $\theta_9$ are close to 90 degrees) (the difference between the diameters of both ends of the respective openings 100 and the difference between the diameters of both ends of the respective openings 102 can be reduced), and hence the openings 100 and 102 can be reduced in terms of a diameter.

The openings 100 and 102 are opened in the insulation layers 82 and 87, by use of only the portion of the laser 271 corresponding to the high energy region 272, whereby the core material 95 becomes more easily processed as compared with the case of the related art. Hence, the extent to which the core material 95 projects into the openings 100 can be reduced. As a result, in a case where the vias 84 and 88 are generated by means of; for instance, plating, a sufficient amount of plating fluid can be supplied to the inside of the openings 100 and 102. Hence, the reliability of electrical connection between the electronic component connection pads 81 and the wiring patterns 85 and the reliability of electrical connection between the external connection pads 91 and the pads 98 can be enhanced.

The present embodiment has been described by means of taking, as an example, the case where one wiring board 80 is fabricated on the support 111. However, structures corresponding to the plurality of wiring boards 80 may also be formed on the support 111 having a plurality of areas where the wiring boards 80 are to be fabricated, and the support 111 may be removed later. Subsequently, the structures corresponding to the plurality of wiring boards 80 are cut, to thus be separated into pieces.

The preferred embodiments of the present invention have been described in detail. However, the present invention is not limited to the specific embodiments but susceptible to various modifications and alterations within the scope of the gist of the present invention described in the appended claims.

For instance, the insulation layers 24, 28, 38, and 43 may also be formed by use of the insulation layer generation member 113 described in connection with the second embodiment in place of the insulation layer generation member 73 described in connection with the first embodiment (i.e., the core material 95 may also be provided in the insulation layers 24, 28, 38, and 43). Moreover, the insulation layers 82 and 87 may also be generated by use of the insulation layer generation member 73 described in connection with the first embodiment in place of the insulation layer generation member 113 described in connection with the second embodiment (i.e., the insulation layers 82 and 87 not having the core material 95 may also be used).

Further, for instance, the support film 74 may be provided on the cured insulation layer 24, 28, 38, 43, 82 and 87 (i.e., the support film 74 may be provided after the semi-cured insulation layers 75, 114 are cured. By reference to FIGS. 32 through 38, the method for manufacturing the wiring board 10 of the modified example of the first embodiment will be described. In FIGS. 32 through 38 constituent elements which are the same as those of the structure shown in FIG. 5 described in connection with the first embodiment are assigned the same reference numerals.

Figure 32:
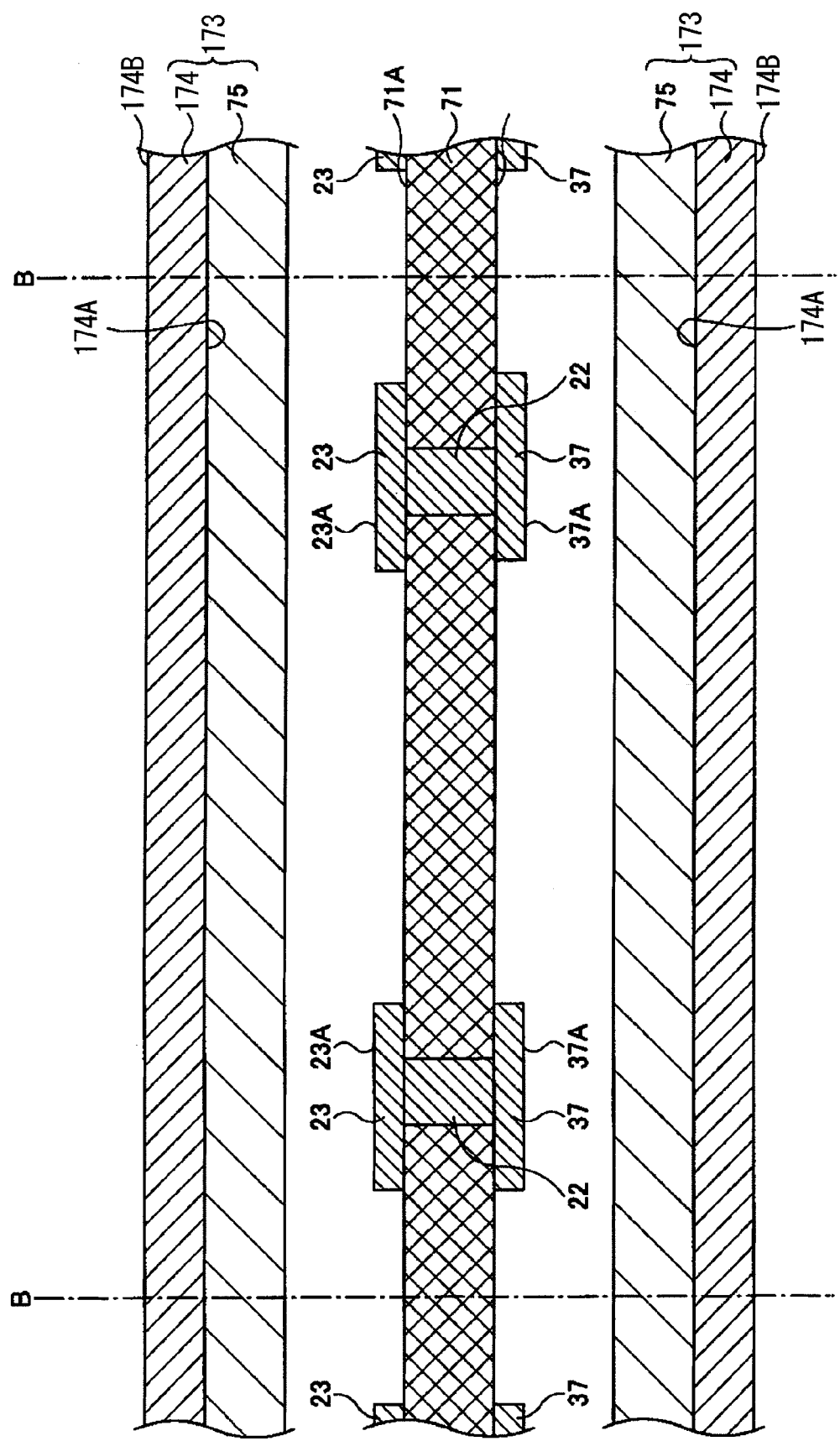
FIG. 32 is a view showing a process for manufacturing the wiring board of a modified example of the first embodiment of the present invention.

In a process shown in FIG. 32, there is prepared a core substrate 71 (See FIG. 6) and an insulation layer generation member 173 having a support film 174 and an insulation layer 75 that is provided on a surface 174A (one surface) of the support film 174 and that is in a semi-cured state (an insulation layer generation member preparation step). Two insulation layer generation members 173 are prepared in this process. The support film 174 is a film for supporting the insulation layer 75. The insulation layer generation member 173 may be the same as the insulation layer generation member 73, and polyester such as PET (polyethylene terephthalate), polyethylene, polyolefin such as polyvinyl chloride, polycarbonate, and the like, can be used as a material for the support film 174. However, it is not necessary to consider the laser processing for the material of the support film 174 because the support film 174 is removed before the laser processing to be described in later. For instance, the material difficult to be processed by the laser 271 can be used as the material for the support film 174.

Figure 33:
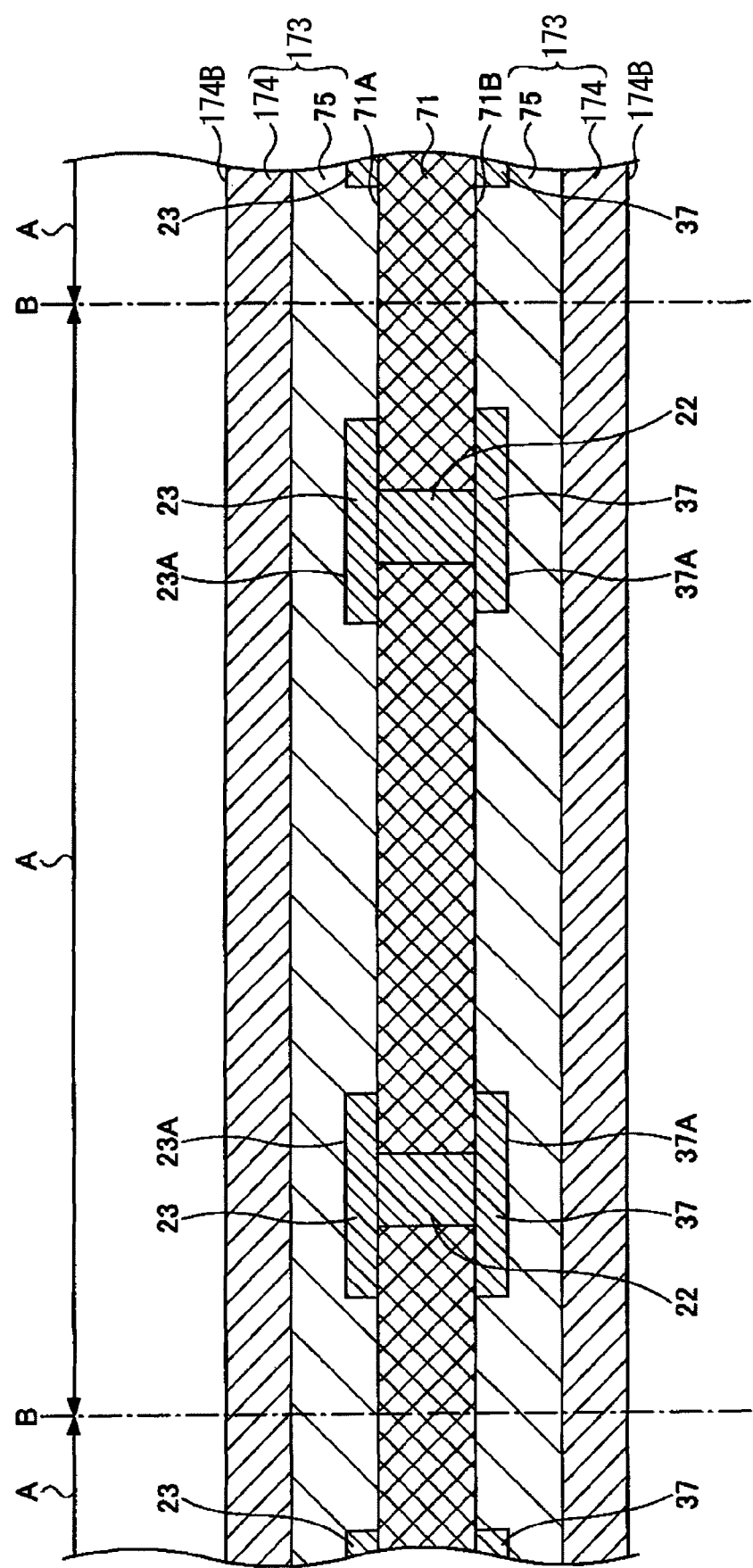
FIG. 33 is a view showing a process for manufacturing the wiring board of the modified example of the first embodiment of the present invention.

In a process shown in FIG. 33, the insulation layer generation member 173 is affixed to both surfaces of the structure shown in FIG. 6 in such a manner that both surfaces of the structure shown in FIG. 6 (specifically, the upper surface 71A of the core substrate 71 on which the pads 23 are formed and the lower surface 71B of the core substrate 71 on which the pads 37 are formed) contact the semi-cured insulation layer 75 (an insulation layer generation member affixing step). Specifically, the insulation layer generation member 173 is affixed to both surfaces of the structure shown in FIG. 6 by means of; for instance, vacuum thermo-compression bonding. The insulation layer 75 affixed to the upper surface 71A of the core substrate 71 is a layer which will turn into the insulation layer 24 (see FIG. 5) as a result of being cured in a process shown in FIG. 34 to be described later. The insulation layer 75 affixed to the lower surface 71B of the core substrate 71 is a layer which will turn into the insulation layer 38 (see FIG. 5) as a result of being cured in a process shown in FIG. 34 to be described later.

Figure 34:
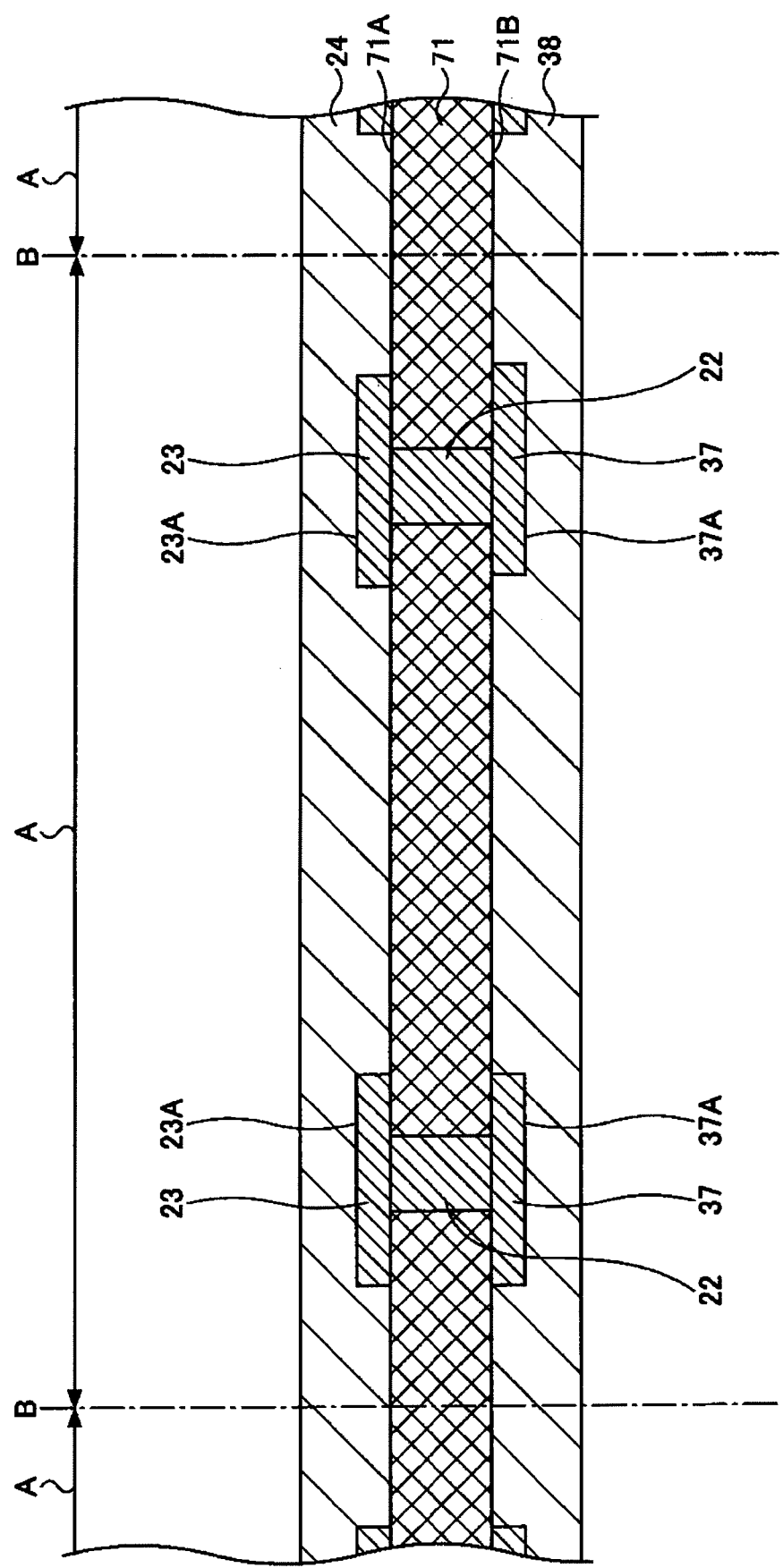
FIG. 34 is a view showing a process for manufacturing the wiring board of the modified example of the first embodiment of the present invention.

Next, the insulation layers 75, which are semi-cured and shown in FIG. 33, are cured in the process shown in FIG. 34, thereby simultaneously generating the insulation layer 24 (a cured insulation layer) on the upper surface 71A of the core substrate 71 and the insulation layer 38 (a cured insulation layer) on the lower surface 71B of the core substrate 71 (an insulation layer curing step). Specifically, for instance, when the insulation layers 75 are formed from a thermosetting resin that serves as a base material, the structure shown in FIG. 33 is heated (at a heating temperature of; for instance, 180° C.), to thus generate the cured insulation layers 24 and 38. Further, the two support films 174 provided on the structure shown in FIG. 33 are removed in the process shown in FIG. 34 (a first film removal step). Specifically, the support films 174 are striped from the insulation layers 24 and 38 provided on the structure shown in FIG. 33, thereby removing the support films 174.

Figure 35:
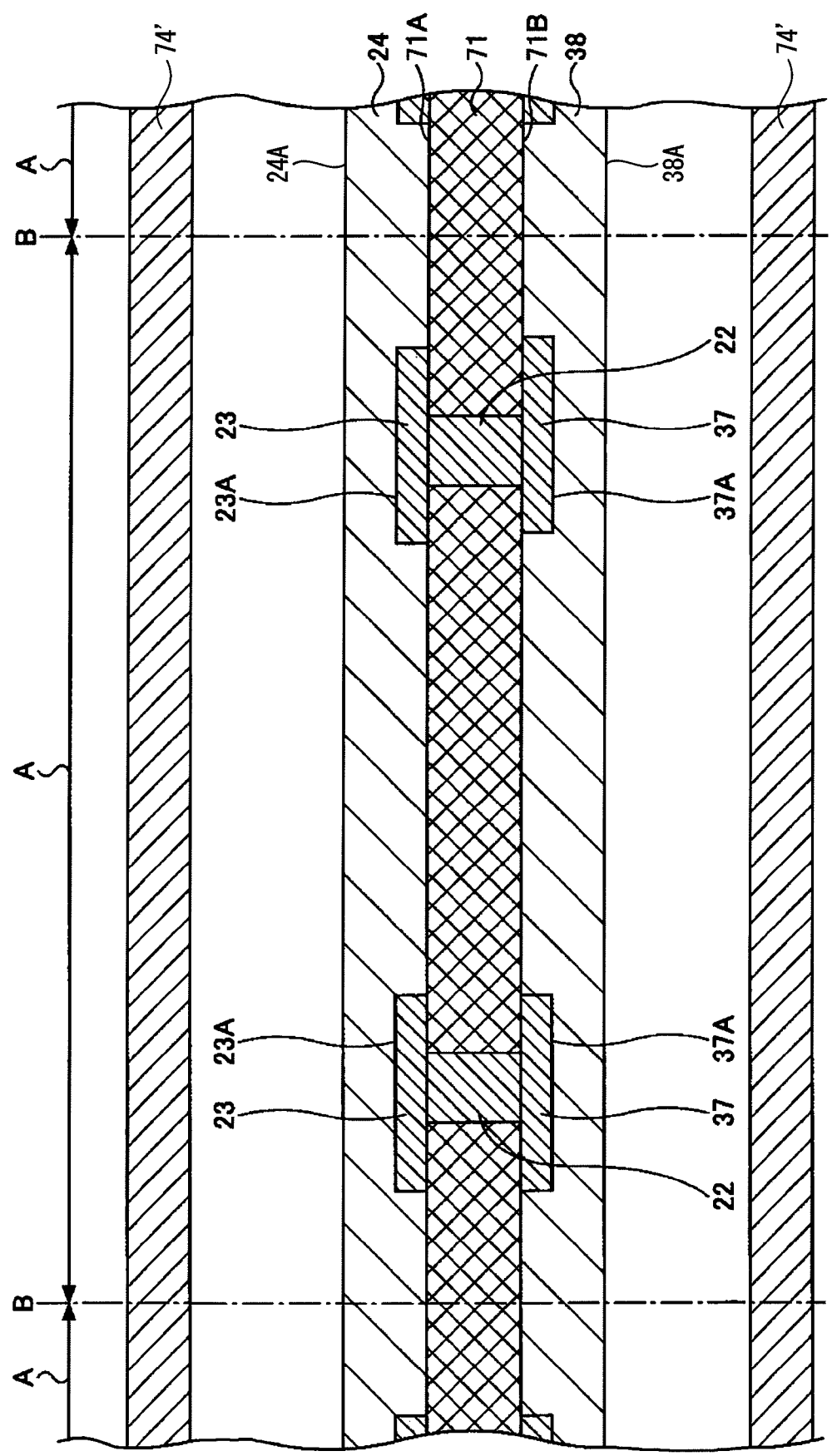
FIG. 35 is a view showing a process for manufacturing the wiring board of the modified example of the first embodiment of the present invention.

Next, in a process shown in FIG. 35, there is prepared a film 74' for generating the openings 51, 61 for the insulation layers 24, 38. The same material of the support film 74 of the first embodiment can be used for a material of the films 74'. For instance, polyester such as PET (polyethylene terephthalate), polyethylene, polyolefin such as polyvinyl chloride, polycarbonate, and the like, can be used as a material for the film 74'.

Figure 36:
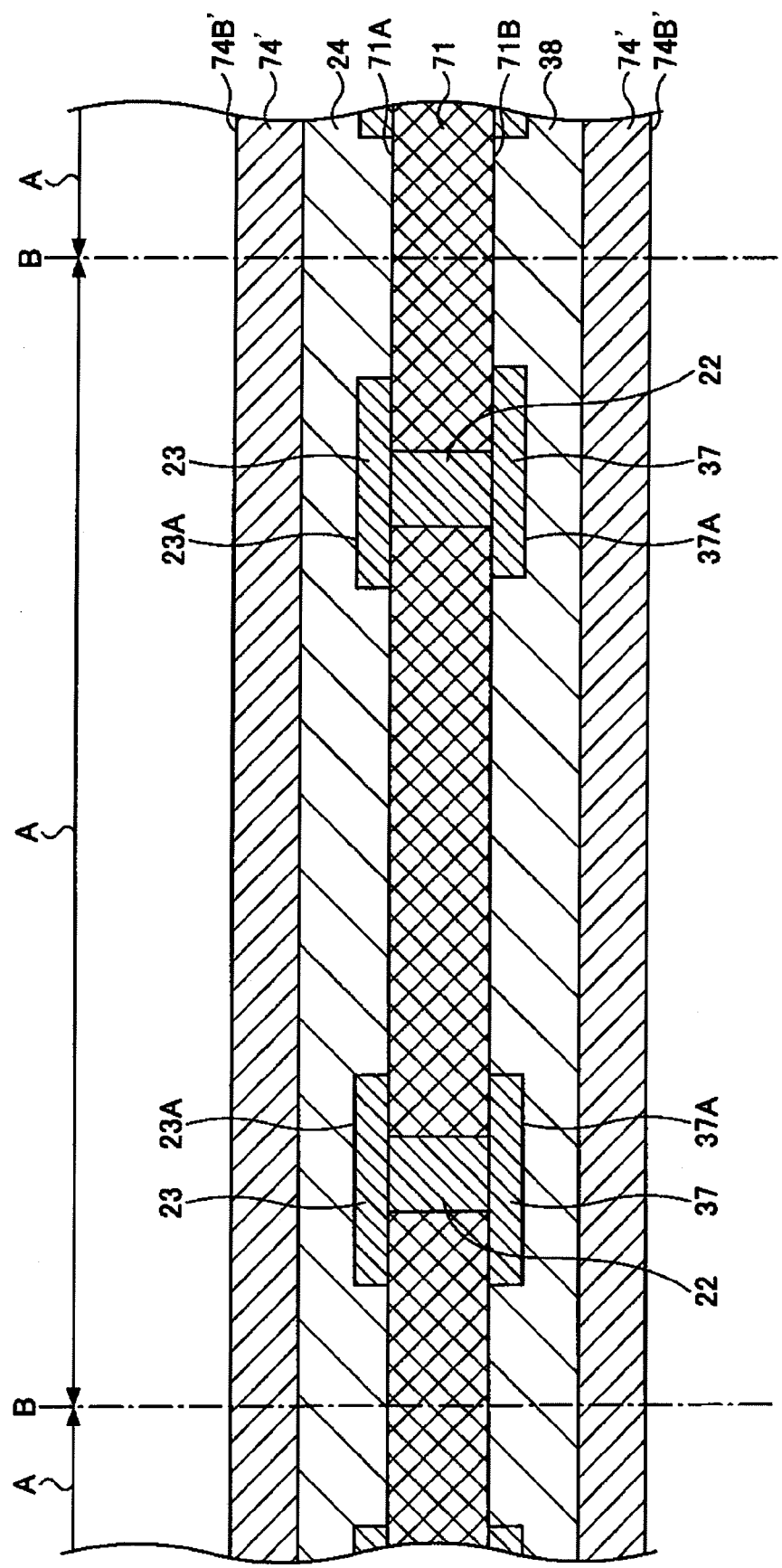
FIG. 36 is a view showing a process for manufacturing the wiring board of the modified example of the first embodiment of the present invention.

In a process shown in FIG. 36, the films 74' are affixed to both surfaces of the structure shown in FIG. 34, respectively, specifically, to the upper surface 24A of the insulation layer 24 and the lower surface 38A of the insulation layer 38 (a second film providing step). Specifically, the films 74' are affixed on the insulation layers 24, 38 through adhesive material (not shown). For instance, the adhesive material composed of epoxy, polyimide or the like can be used.

Subsequently, in a process shown in FIG. 37, the cured insulation layers 24 and 38 are exposed to the laser 271 (see FIG. 3) by way of the films 74'. Put another way, the surface 74B' of the film 74' (the surface of the film 74' that is not in contact with the insulation layers 24 and 38) is exposed to the laser 271, to thus generate, in the insulation layer 24, the openings 51 through which the upper surfaces 23A of the pads 23 are partially exposed and, in the insulation layer 38, the openings 61 through which the lower surfaces 37A of the pads 37 are partially exposed (an opening generation step).

Figure 37:
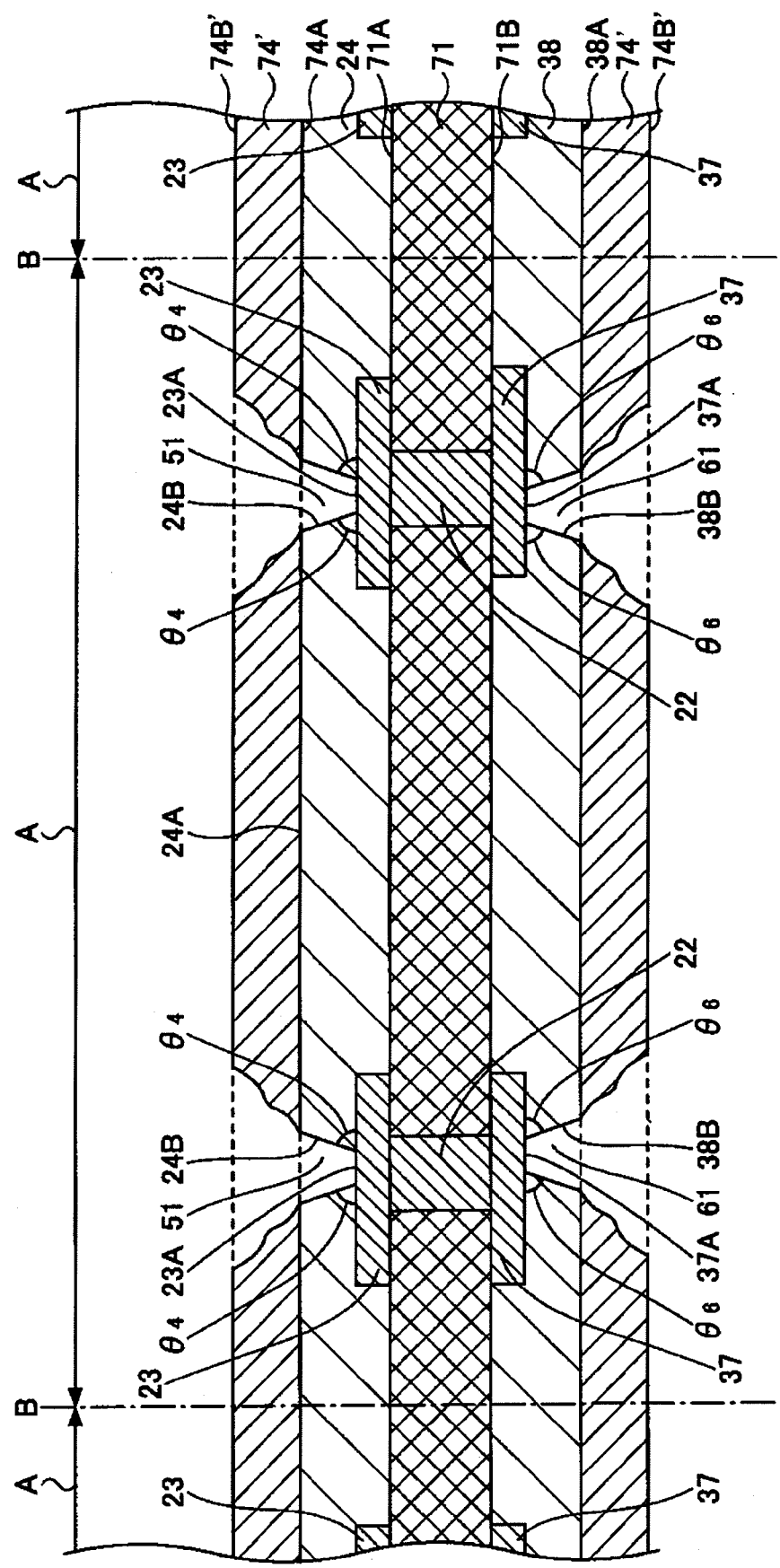
FIG. 37 is a view showing a process for manufacturing the wiring board of the modified example of the first embodiment of the present invention.
Figure 38:
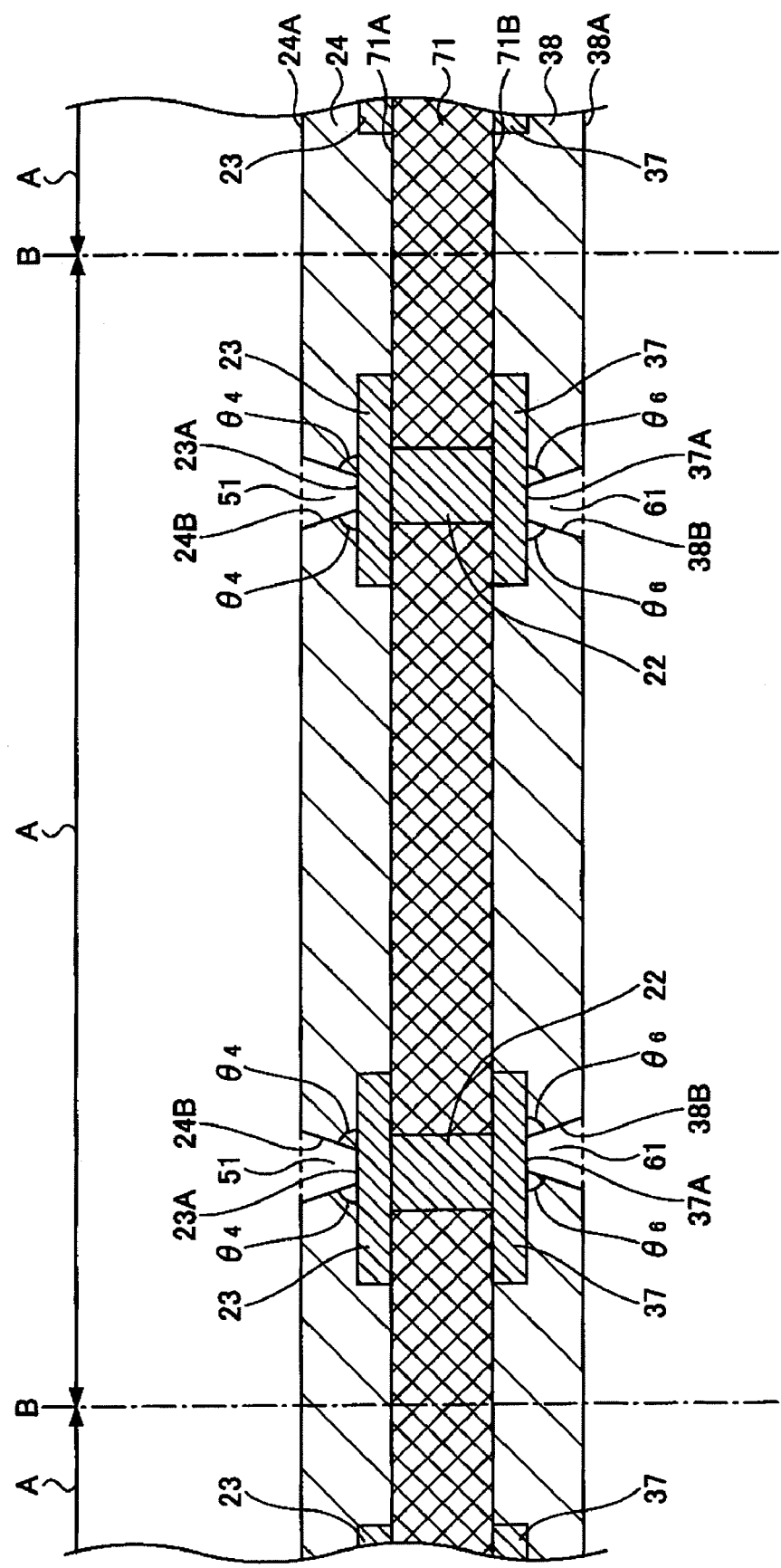
FIG. 38 is a view showing a process for manufacturing the wiring board of the modified example of the first embodiment of the present invention.

Next, the two films 74' provided on the structure shown in FIG. 37 are removed in a process shown in FIG. 38 (a second film removal step). Specifically, the films 74' are striped from the insulation layers 24 and 38 provided on the structure shown in FIG. 37, thereby removing the films 74'. The subsequent processes (for example, a process for generating vias 26, 39 and the wiring patterns 27, 41, a process for generating the insulation layers 28, 43, and the like) are similar to that pertaining to the previously-described processes in the first embodiment and also in FIGS. 32 through 38, and thus the detailed explanation thereabout will be omitted. According to the method for manufacturing a wiring board, the same effects of the first embodiment can be obtained. The support film, 174 and the opening generation film 74' may be used in the second embodiment in place of the support film 74.

The present invention can be applied to a method for manufacturing a wiring board having insulation layers covering pads, openings which are formed in the insulation layers by means of laser and through which the pads are partially exposed, and vias that are provided in the respective openings and that are connected to the pads.

What is claimed is:
1. A method for manufacturing a wiring board, comprising:
an insulation layer generation member preparation step of preparing an insulation layer generation member having a support film and a semi-cured insulation layer provided on a surface of the support film;
an insulation layer generation member affixing step of affixing the insulation layer generation member to a pad such that the pad contacts the semi-cured insulation layer;

an insulation layer curing step of curing the semi-cured insulation layer after the insulation layer generation member affixing step; and an opening generation step of exposing the cured insulation layer to a laser by way of the support film, wherein the laser is irradiated onto a top surface of the support film thereby opening an opening in the support film and an opening in the cured insulation layer, the support film preventing exposure of the insulation layer to a portion of the laser corresponding to a low energy region such that a portion of the laser corresponding to a high energy region forms the opening in the cured insulation layer.

2. The method for manufacturing a wiring board according to claim 1, further comprising:

a support film removal step of removing the support film from the cured insulation layer after the opening generation step; and a via generation step of generating a via in the opening after the support film removal step.

3. The method for manufacturing a wiring board according to claim 2, wherein removal of the support film is performed immediately before the via generation step.

4. The method for manufacturing a wiring board according to claim 1, wherein the semi-cured insulation layer is a semi-cured resin layer containing silica particles.

5. The method for manufacturing a wiring board according to claim 1, wherein the semi-cured insulation layer has a core material and a semi-cured resin layer covering the core material.

6. The method for manufacturing a wiring board according to claim 5, wherein the semi-cured resin layer contains silica particles.

7. The method for manufacturing a wiring board according to claim 5, wherein the core material is glass fiber.

8. The method for manufacturing a wiring board according to claim 1, wherein the support film is made of a resin.

9. The method for manufacturing a wiring board according to claim 1, wherein in the opening generation step, the opening is formed in the support film and the insulation layer at the same time, and the opening exposes the pad.

* * * * *